United States Patent
Kubo et al.

(10) Patent No.: US 6,343,035 B1
(45) Date of Patent: Jan. 29, 2002

(54) SEMICONDUCTOR DEVICE ALLOWING SWITCHABLE USE OF INTERNAL DATA BUSES

(75) Inventors: Takashi Kubo; Jun Setogawa; Takeshi Hamamoto, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/708,607

(22) Filed: Nov. 9, 2000

(30) Foreign Application Priority Data

Nov. 11, 1999 (JP) ............................................ 11-320510

(51) Int. Cl.[7] ................................................. G11C 7/00
(52) U.S. Cl. .................... 365/189.05; 365/203; 365/207
(58) Field of Search ............................. 365/189.05, 190, 365/63, 203, 207

(56) References Cited

U.S. PATENT DOCUMENTS 5,598,371 A    1/1997   Lee et al. ............... 365/189.05
5,715,210 A    2/1998   Yoo et al. ............... 365/230.06
5,745,431 A *  4/1998   Pontius et al. ........... 365/233.5
5,748,540 A *  5/1998   Sugawara ............... 365/189.05
6,040,732 A *  3/2000   Brokaw ....................... 365/327

FOREIGN PATENT DOCUMENTS

JP    8-235869    9/1996
JP    9-106680    4/1997

* cited by examiner

*Primary Examiner*—Son T. Dinh
(74) *Attorney, Agent, or Firm*—McDermott, Will & Emery

(57) ABSTRACT

When a first data bus line and a second data bus line as a pair are used as a complementary bus, a complementary data signal ZDATA1 is provided to the second data bus line, and an output buffer circuit that becomes unnecessary is rendered inactive. On the other hand, when the first and second data bus lines are used as two single data buses, a differential amplifier transmits two data signals without amplification to the first and second data bus lines. A data signal DATA2 is provided to the second data bus line. The output buffer circuit is activated, and a data signal ZDATA2 is output from an output node.

10 Claims, 20 Drawing Sheets

SEMICONDUCTOR DEVICE ALLOWING SWITCHABLE USE OF INTERNAL DATA BUSES

BACKGROUND OF THE INVENTION

1. Field of the Invention

The present invention relates to a semiconductor device, and more specifically to a semiconductor device internally provided with a data bus.

2. Description of the Background Art

In a semiconductor device, the simplest method of transferring data from one functional block to another is to use one internal data bus for one bit of data, and to set that one internal data bus to the logic high or "H" level, or to the logic low or "L" level.

Such an internal data bus is herein referred to as a single data bus.

FIG. 11 is a diagram relating to a description of a single data bus in a conventional semiconductor device.

In FIG. 11, semiconductor device 701 includes an internal circuit 702 which is a first functional block, and an output circuit 704 which is a second functional block for receiving data from internal circuit 702 via a single data bus and for outputting the data to an external data bus 708.

Internal circuit 702 generates a data signal DATA internally and includes inverters 728 and 730 connected in series for amplifying data signal DATA and for outputting the amplified signal on the single data bus.

Output circuit 704 includes an inverter 748 for receiving and inverting a clock signal CLKO, a transmission gate 750 for taking in the data on the single bus according to clock signal CLKO and to an output from inverter 748, inverters 752 and 754 forming a latch circuit for latching the data taken in by transmission gate 750, an inverter 756 for receiving and inverting an output enable signal OE, and P-channel MOS transistors 758, 760 and N-channel MOS transistors 762, 764 connected in series between a power-supply node and a ground node.

P-channel MOS transistor 758 receives an output from inverter 756 at a gate. N-channel MOS transistor 764 receives output enable signal OE at a gate. Thus, P-channel MOS transistor 758 and N-channel MOS transistor 764 are activated when output enable signal OE is at the "H" level so that outputting of data becomes possible.

P-channel MOS transistor 760 and N-channel MOS transistor 762 receive an output from inverter 752 at the gates. The node connecting P-channel MOS transistor 760 and N-channel MOS transistor 762 forms an output node for output circuit 704, and is connected to external data bus 708. Other semiconductor devices 710 and 712 are connected to external data bus 708.

Semiconductor devices 710 and 712 include output circuits similar to that in semiconductor device 701, and the output nodes of these output circuits are connected to external data bus 708.

Generally, when a plurality of semiconductor devices share one external data bus as in FIG. 11, an output circuit is driven during the period in which data is effective and outputs the data to the external data bus, while the external data bus is cut off from output circuit during the period in which data is ineffective. The output circuit may be cut off from the external data bus by setting output enable signal OE to the "L" level.

FIG. 12 is an operational waveform chart for semiconductor device 701 shown in FIG. 11 when outputting data.

Referring to FIG. 12, let us consider the case in which internal circuit 702 outputs data signal DATA at time t1. The data signal transmitted via a single bus as far as the vicinity of output circuit 704 is referred to as DATAD. Due to propagation delay of data, at time t1, data signal DATAD has not yet been transmitted so that the data on the data bus is ineffective.

At time t2, data signal DATAD becomes effective. At time t3, clock signal CLKO and output enable signal OE, which serve as trigger signals to decide the timing at which data is output to the external data bus, are activated after data signal DATAD definitely attains the effective state, and thereafter, effective data is output on an external data bus EBUS.

If, for instance, clock signal CLKO and output enable signal OE are activated before time t2, ineffective data would be output on external data bus EBUS.

There also is, however, a potential problem, in avoiding outputting of ineffective data, that the timing for outputting data could be delayed if the timing at which clock signal CLKO and output enable signal OE are activated is held off too long after the time when data becomes definite at time t2.

This problem may be circumvented by the use of a complementary data bus.

FIG. 13 is a diagram related to a description of a complementary data bus.

As shown in FIG. 13, semiconductor device 801 includes an internal circuit 802 for internally generating and outputting complementary data signals DATA and ZDATA, a complementary data bus 806 for receiving outputs from internal circuit 802, and an output circuit 804 for receiving data from the complementary data bus and for outputting the received data to the outside.

Internal circuit 802 includes inverters 828 and 830 connected in series for outputting data signal DATA to the complementary data bus 806, and inverters 832 and 834 connected in series for receiving data signal ZDATA complementary to data signal DATA and for outputting the received data signal to complementary data bus 806.

Complementary data bus 806 includes a data bus line 806a for transmitting a data signal DATAD corresponding to data signal DATA to output circuit 804, and a data bus line 806b for transmitting a data signal ZDATAD corresponding to data signal ZDATA to output circuit 804.

Output circuit 804 includes an inverter 852 for receiving and inverting data signal DATAD, and a P-channel MOS transistor 860 and an N-channel MOS transistor 862 connected in series between a power-supply node and a ground node. A gate of P-channel MOS transistor 860 receives an output from inverter 852. A gate of N-channel MOS transistor 862 receives data signal ZDATAD. The node connecting P-channel MOS transistor 860 and N-channel MOS transistor 862 forms an output node for output circuit 804, and is connected to external data bus 808.

Other semiconductor devices 810 and 812 are connected to external data bus 808. Semiconductor devices 810 and 812 include output circuits similar to that in semiconductor device 804, and the output nodes of these output circuits are connected to external data bus 808.

FIG. 14 is an operational waveform chart related to a description of an operation of the complementary bus shown in FIG. 13.

Referring to FIGS. 13 and 14, data signals DATA and ZDATA are both at the "L" level before time t1. This state is the standby state of the complementary bus.

At time t1, one of data signals DATA and ZDATA attains the "H" level and the effective data is output.

At time t2, one of data signals DATAD and ZDATAD after the delay time caused by complementary data bus 806 attains the "H" level, and the effective data is propagated to output circuit 804. Accordingly, at time t3, one of P-channel MOS transistor 860 and N-channel MOS transistor 862 is rendered conductive, and the effective data is output to external data bus 808.

Since the standby state of the complementary bus is defined by the condition of both P-channel MOS transistor 860 and N-channel MOS transistor 862 being non-conductive, the transition of data from its ineffective state to the effective state triggers the outputting of the data to the external data bus. Therefore, when compared with the case of FIG. 12, the delay time between time t2 and time t3 is substantially eliminated and the period for which data is effective is fully utilized in the case of FIG. 14.

Next, let us consider a case in which the single data bus shown in FIG. 11 has a very heavy load capacitance.

FIG. 15 is an operational waveform chart of a case in which a single data bus has a heavy load capacitance.

As shown in FIGS. 11 and 15, the data of data signal DATA becomes effective at time t1. Since, however, the load capacitance of the single data bus is great, a very long transition period will be required before data signal DATAD on the data bus definitely attains the effective state.

Thus, clock signal CLKO and output enable signal OE must be activated at time t2 considerably delayed from time t1 to output the data to the external data bus. In other words, in order to ensure that effective data is taken in, clock signal CLKO must standby for a considerable length of time before the effective data appears on an internal data bus.

Even in such a case, the delay time may be shortened by the use of a complementary data bus and by an output circuit using a differential amplifier to amplify the potential difference between complementary data bus lines.

FIG. 16 is a simple representation of a configuration of a semiconductor device 901 in which an output circuit is provided with a differential amplifier.

As shown in FIG. 16, semiconductor device 901 includes an internal circuit 902 for generating and outputting complementary data signals DATA and ZDATA, a complementary data bus 906, and an output circuit 904.

Internal circuit 902 includes inverters 928 and 930 connected in series for transmitting data signal DATA to complementary data bus 906, and inverters 932 and 934 connected in series for transmitting data signal ZDATA to complementary data bus 906.

Output circuit 904 includes a differential amplifier 942 for amplifying the potential difference appearing on complementary data bus 906 and for outputting the amplified potential difference, an inverter 948 for receiving and inverting a clock signal CLKO, a transmission gate 950 for transmitting an output from differential amplifier 942 according to dock signal CLKO and to an output from inverter 948, inverters 952 and 954 forming a latch circuit for latching the output from differential amplifier 942 taken in by transmission gate 950, an inverter 956 for receiving and inverting an output enable signal OE, and P-channel MOS transistors 958, 960 and N-channel MOS transistors 962, 964 connected in series between a power-supply node and a ground node. N-channel MOS transistor 964 receives output enable signal OE at a gate. P-channel MOS transistor 958 receives an output from inverter 956 at a gate.

P-channel MOS transistor 960 and N-channel MOS transistor 962 both receive an output from inverter 952 at the gates. The node connecting N-channel MOS transistor 962 and P-channel MOS transistor 960 forms an output node for output circuit 904, and is connected to external data bus 908.

Other semiconductor devices 910 and 912 are connected to external data bus 908.

FIG. 17 is a circuit diagram showing a configuration of differential amplifier 942 shown in FIG. 16.

As shown in FIG. 17, differential amplifier 942 includes a gate circuit 972 for taking in the data transmitted via data bus lines 906a and 906b included in complementary data bus 906, an equaling circuit 974 for equalizing data bus lines 907a and 907b, and a sense amplifier circuit 976 for amplifying the potential difference appearing on data bus lines 907a and 907b.

Gate circuit 972 includes an N-channel MOS transistor 978 connected between data bus lines 906a and 907a for receiving a control signal GATE at a gate, and an N-channel MOS transistor 980 connected between data bus lines 906b and 907b for receiving control signal GATE at a gate.

Equalizing circuit 974 includes an N-channel MOS transistor 982 connected between data bus line 907a and a ground node for receiving an equalizing signal EQ at a gate, and an N-channel MOS transistor 984 connected between data bus line 907b and the ground node for receiving equalizing signal EQ at a gate.

Sense amplifier circuit 976 includes an inverter 985 for receiving and inverting a control signal AMP, a P-channel MOS transistor 986 for receiving an output from inverter 985 at a gate and having a source connected to a power-supply node, an N-channel MOS transistor 988 for receiving control signal AMP at a gate and having a source connected to a ground node, a P-channel MOS transistor 990 and an N-channel MOS transistor 992 connected in series between a drain of P-channel MOS transistor 986 and a drain of N-channel MOS transistor 988 and both having a gate connected to data bus line 907b, and a P-channel MOS transistor 994 and an N-channel MOS transistor 996 connected in series between a drain of P-channel MOS transistor 986 and a drain of N-channel MOS transistor 988 and both having a gate connected to data bus line 907a.

The node connecting P-channel MOS transistor 990 and N-channel MOS transistor 992 is connected to data bus line 907a. The node connecting P-channel MOS transistor 994 and N-channel MOS transistor 996 is connected to data bus line 907b.

FIG. 18 is an operational waveform chart related to a description of an operation of the differential amplifier shown in FIG. 17.

Referring to FIGS. 17 and 18, at time t1, equalizing signal EQ falls to the "L" level, control signal GATE is activated, and the potential difference generated by data transmitted via data bus lines 906a and 906b appears on data bus lines 907a and 907b.

At time t2, control signal GATE falls to the "L" level. Then, control signal AMP rises to the "H" level, and sense amplifier circuit 976 is activated. Accordingly, the potential difference between data bus lines 907a and 907b is magnified, and the amplitudes of data signals DATAD and ZDATAD are amplified. Thus, data is output to the outside.

At time t3, control signal AMP falls to the "L" level, the equalizing signal once again is activated to the "H" level, and the differential amplifier enters the standby state.

FIG. 19 is an operational waveform chart showing how data is transmitted in semiconductor device 901 shown in FIG. 16.

Referring to FIGS. 16 and 19, the effective data is output from internal circuit 902 at time t1.

At time t2, data is transmitted via complementary data bus 906 as far as to differential amplifier 942. At time t3, the potential difference appearing on the complementary data bus is magnified by the operation of differential amplifier 942. Then at time t4, the effective data amplified by differential amplifier 942 is taken into a section in the output circuit, and the data is output to the external data bus.

At time t5, the equalizing signal within differential amplifier 942 is activated, and at time t6, differential amplifier 942 once again enters the standby state.

As described above, even in view of the disadvantage of increased surface area due to an increase in the number of interconnection lines, a complementary data bus would be employed if the advantages of using the complementary data bus prevail.

It might be noted, however, in respect of data transfer speed, the complementary data bus is not always absolutely advantageous.

FIG. 20 is a diagram showing a comparison of data transfers using a single data bus and a complementary data bus.

In the case of data transfer via the complementary data bus, the access time, or the period of time required from the time when data is output from an internal circuit and the data transfer begins to the time when data is output to the outside, is short. In contrast, the access time is long with a single data bus since a differential amplifier or the like is not provided. Thus, the cycle in which data is transmitted can also be made shorter with the complementary data bus.

When the same number of interconnection lines are used, however, the single data buses can transfer twice as much data as the complementary buses. Therefore, much use can be expected of the single data bus even with its accompanying disadvantages of somewhat lowered transfer frequency and a slight reduction in the access speed.

It is of great importance, therefore, to implement either the function of a semiconductor device having complementary data buses for transferring n bits of data or the function of a semiconductor device having single data buses for transferring 2n bits of data in the same chip by the switching of a control signal, or to do so with master slices by changing the masks used when forming a metal interconnection layer.

SUMMARY OF THE INVENTION

One object of the present invention is to provide a semiconductor device that allows data buses that are internally provided to be switchably used either as complementary data buses for transmitting n bits or as single data buses for transmitting 2n bits according to the intended use.

The present invention is a semiconductor device provided with an internal circuit, first and second data bus lines, and an output circuit. The internal circuit includes a data output portion for outputting a first data signal, a second data signal, and a third data signal complementary to the first data signal, and a first switching circuit for outputting one of the second data signal and the third data signal. The first data bus line receives the first data signal. The second data bus line receives an output from the first switching circuit. The output circuit outputs to the outside a signal corresponding to data transmitted via the first data bus line and the second data bus line. The output circuit includes a first output buffer circuit for outputting a first output signal corresponding to the first data signal, and a second output buffer circuit which outputs a second output signal corresponding to the second data signal when the first switching circuit outputs the second data signal, and which is rendered non-active when the first switching circuit outputs the third data signal.

Thus, the main advantage of the present invention is that one chip of semiconductor memory device can be made to perform a variety of operations owing to the fact that a data bus internally provided can be switchably used either as a data bus for transmitting complementary data or as a data bus for transmitting single data.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
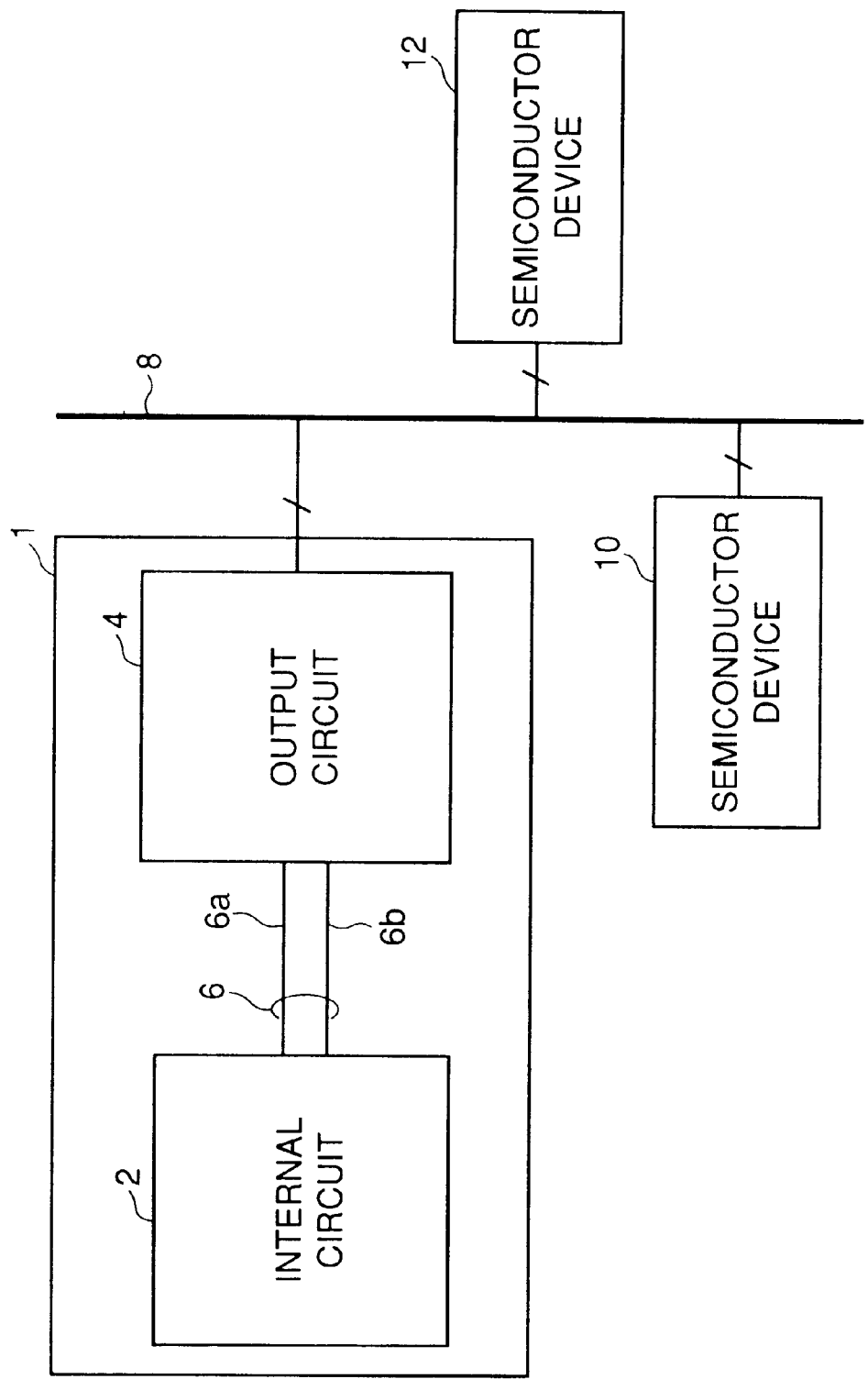
FIG. 1 is a block diagram representing a schematic configuration of a semiconductor device 1 according to a first embodiment of the present invention.

The embodiments of the present invention will be described in detail below with reference to the drawings. Throughout the drawings, the same reference characters indicate the same or corresponding parts.

First Embodiment

FIG. 1 is a block diagram representing a schematic configuration of a semiconductor device 1 according to the first embodiment of the present invention.

As shown in FIG. 1, a semiconductor device 1 includes an internal circuit 2 for outputting a data signal, a data bus 6 for receiving data from internal circuit 2, and an output circuit 4 for receiving data from data bus 6. Data bus 6 includes data bus lines 6a and 6b.

Output circuit 4 outputs data to an external data bus 8 provided outside of semiconductor device 1. Other semiconductor devices 10 and 12 are connected to external data bus 8, and thus, external data bus 8 is shared by these semiconductor devices.

Figure 2:
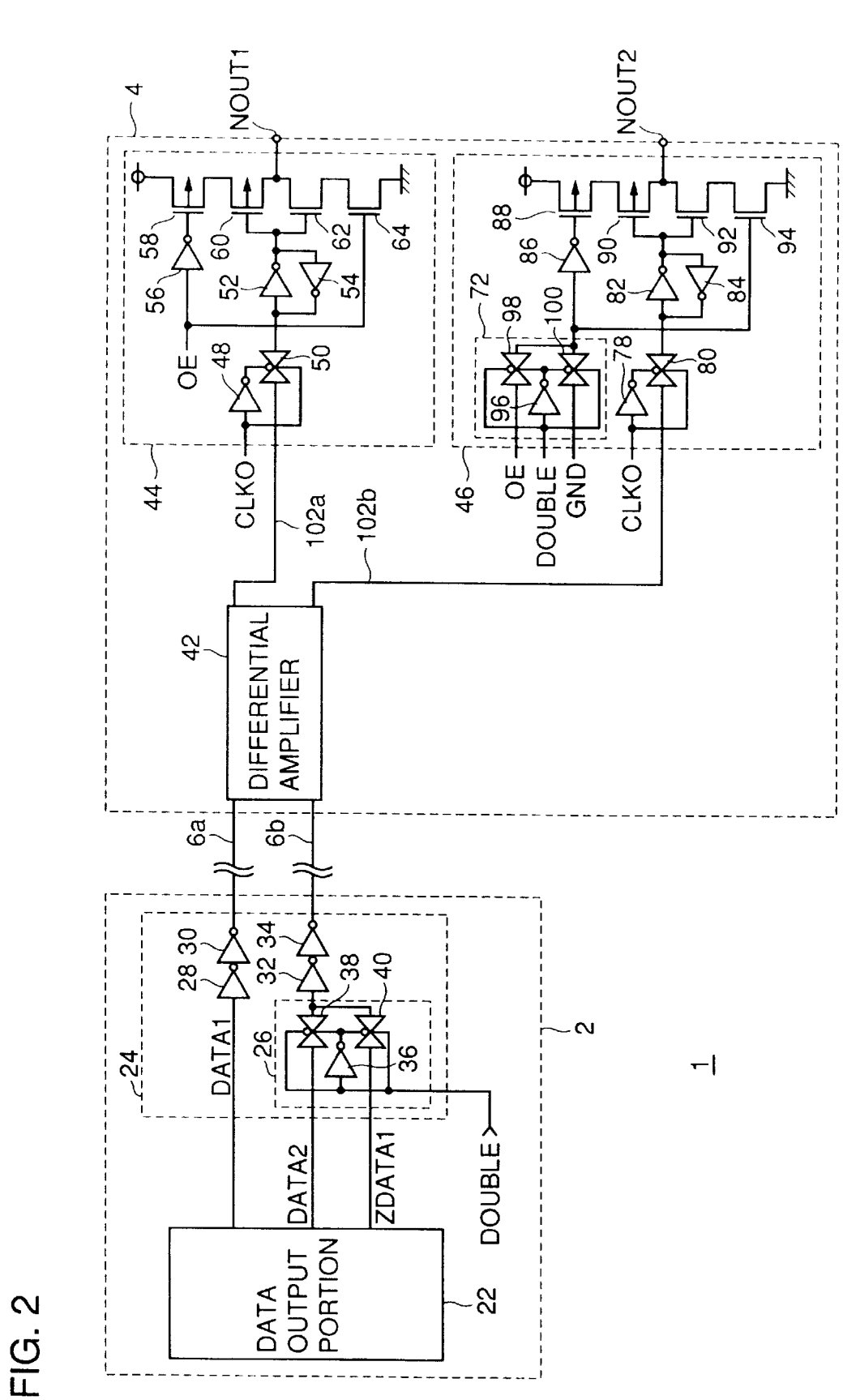
FIG. 2 is a circuit diagram representing a detailed configuration of semiconductor device 1 shown in FIG. 1.

FIG. 2 is a circuit diagram representing a detailed configuration of semiconductor device 1 shown in FIG. 1.

As shown in FIG. 2, internal circuit 2 includes a data output portion 22 for outputting data signals DATA1 and DATA2, and a data signal ZDATA1 complementary to data signal DATA1, and a bus driving circuit 24 for receiving data signals DATA1, ZDATA1, and DATA2 and for outputting data on data bus lines 6a and 6b.

Bus driving circuit 24 includes inverters 28 and 30 connected in series and for receiving data signal DATA1 and for amplifying and outputting data to data bus line 6a, a switching circuit 26 for selecting one of data signal DATA2 and data signal ZDATA1 by switching, and inverters 32 and 34 connected in series and for receiving an output from switching circuit 26 and for amplifying and outputting data to data bus line 6b.

Switching circuit 26 includes an inverter 36 for receiving and inverting a control signal DOUBLE, a transmission gate 40 for transmitting data signal ZDATA1 when control signal DOUBLE is at the "H" level, and a transmission gate 38 for transmitting data signal DATA2 when control signal DOUBLE is at the "L" level.

Output circuit 4 includes a differential amplifier 42 for transmitting data transmitted via data bus lines 6a and 6b on data bus lines 102a and 102b, an output buffer circuit 44 for taking in the data that appear on data bus line 102a and outputting this data from an output node NOUT1, and an output buffer circuit 46 for taking in the data that appear on data bus line 102b and outputting this data from an output node NOUT2. Output nodes NOUT1 and NOUT2 are connected to external data bus 8 shown in FIG. 1. When data bus 6 is used as a complementary data bus, however, no data is output from output node NOUT2 so that output node NOUT2 is not connected to the external data bus, as will be described later.

Output buffer circuit 44 includes an inverter 48 for receiving and inverting a clock signal CLKO, a transmission gate 50 for taking in the data that appear on data bus line 102a when clock signal CLKO is at the "H" level according to clock signal CLKO and to an output from inverter 48, inverters 52 and 54 forming a latch for latching the data taken in by transmission gate 50, an inverter 56 for receiving and inverting an output enable signal OE, P-channel MOS transistors 58 and 60 connected in series between a power-supply node and output node NOUT1, and N-channel MOS transistors 62 and 64 connected in series between output node NOUT1 and a ground node.

P-channel MOS transistor 58 receives an output from inverter 56 at a gate. P-channel MOS transistor 60 receives an output from inverter 52 at a gate. N-channel MOS transistor 62 receives an output from inverter 52 at a gate. N-channel MOS transistor 64 receives output enable signal OE at a gate.

Output buffer circuit 46 includes an inverter 78 for receiving and inverting clock signal CLKO, a transmission gate 80 for taking in the data transmitted via data bus line 102b when clock signal CLKO is at the "H" level according to an output from inverter 78 and to clock signal CLKO, and inverters 82 and 84 forming a latch for holding the data taken in by transmission gate 80.

Output buffer circuit 46 further includes a switching circuit 72 for outputting one of output enable signal OE and a ground potential GND according to control signal DOUBLE, an inverter 86 for receiving and inverting an output from switching circuit 72, P-channel MOS transistors 88 and 90 connected in series between a power-supply node and output node NOUT2, and N-channel MOS transistors 92 and 94 connected in series between output node NOUT2 and a ground node. P-channel MOS transistor 88 receives an output from inverter 86 at a gate. P-channel MOS transistor 90 and N-channel MOS transistor 92 receive an output from inverter 82 at the respective gates. N-channel MOS transistor 94 receives an output from switching circuit 72 at a gate.

Switching circuit 72 includes an inverter 96 for receiving and inverting control signal DOUBLE, a transmission gate 100 for transmitting and outputting ground potential GND when control signal DOUBLE is at the "H" level, and a transmission gate 98 for transmitting and outputting output enable signal OE when control signal DOUBLE is at the "L" level.

Figure 3:
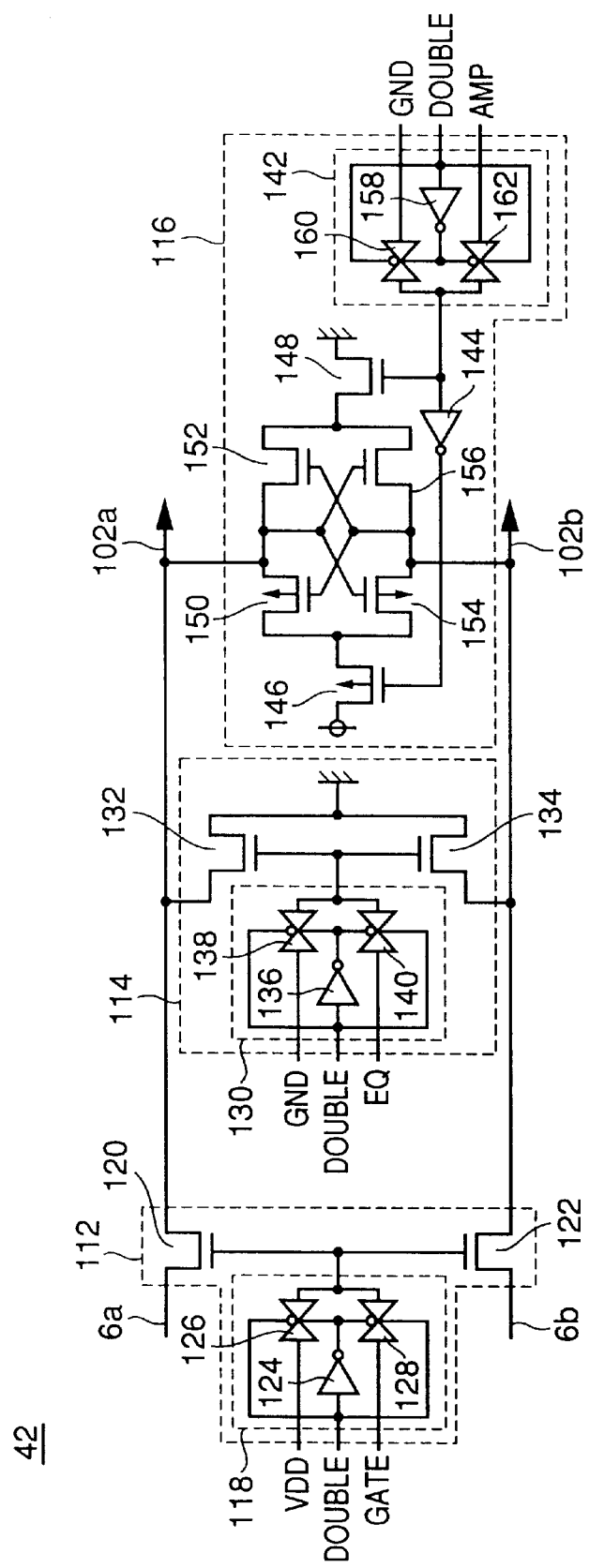
FIG. 3 is a circuit diagram representing a configuration of a differential amplifier 42 shown in FIG. 2.

FIG. 3 is a circuit diagram representing a configuration of differential amplifier 42 shown in FIG. 2.

As shown in FIG. 3, differential amplifier 42 includes a gate circuit 112 connecting data bus lines 6a and 6b respectively to data bus lines 102a and 102b, an equalizing circuit 114 for equalizing the potentials of data bus lines 102a and 102b, and a sense amplifier circuit 116 for amplifying the potential difference appearing between data bus lines 102a and 102b.

Gate circuit 112 includes a switching circuit 118 for outputting one of a control signal GATE and a power supply potential VDD according to a control signal DOUBLE, an N-channel MOS transistor 120 connected between data bus line 6a and data bus line 102a for receiving an output from switching circuit 118 at a gate, and an N-channel MOS transistor 122 connected between data bus line 6b and data bus line 102b for receiving an output from switching circuit 118 at a gate.

Switching circuit 118 includes an inverter 124 for receiving and inverting control signal DOUBLE, a transmission gate 128 for transmitting and outputting control signal GATE when control signal DOUBLE is at the "H" level, and a transmission gate 126 for transmitting and outputting power supply potential VDD when control signal DOUBLE is at the "L" level.

Equalizing circuit 114 includes a switching circuit 130 for switching between an equalizing signal EQ and a ground potential GND and outputting one of equalizing signal EQ and ground potential GND according to control signal DOUBLE, N-channel MOS transistor 132 connected between data bus line 102a and a ground node for receiving an output from switching circuit 130 at a gate, and N-channel MOS transistor 134 connected between data bus line 102b and the ground node for receiving an output from switching circuit 130 at a gate.

Switching circuit 130 includes an inverter 136 for receiving and inverting control signal DOUBLE, a transmission gate 140 for transmitting and outputting equalizing signal EQ when control signal DOUBLE is at the "H" level, and a transmission gate 138 for transmitting and outputting ground potential GND when control signal DOUBLE is at the "L" level.

Sense amplifier circuit 116 includes a switching circuit 142 for switching between a control signal AMP and a ground potential GND and outputting one of control signal AMP and ground potential GND according to control signal DOUBLE, an inverter 144 for receiving and inverting an output from switching circuit 142, a P-channel MOS transistor 146 having a source connected to a power-supply node and for receiving an output from inverter 144 at a gate, an N-channel MOS transistor 148 having a source connected to a ground node and for receiving an output from switching circuit 142 at a gate, a P-channel MOS transistor 150 and an N-channel MOS transistor 152 connected in series between a drain of P-channel MOS transistor 146 and a drain of N-channel MOS transistor 148 and both having a gate connected to data bus line 102b, and a P-channel MOS transistor 154 and an N-channel MOS transistor 156 connected in series between a drain of P-channel MOS transistor 146 and a drain of N-channel MOS transistor 148 and both having a gate connected to data bus line 102a.

The node connecting P-channel MOS transistor 150 and N-channel MOS transistor 152 is connected to data bus line 102a. The node connecting N-channel MOS transistor 156 and P-channel MOS transistor 154 is connected to data bus line 102b.

Figure 4:
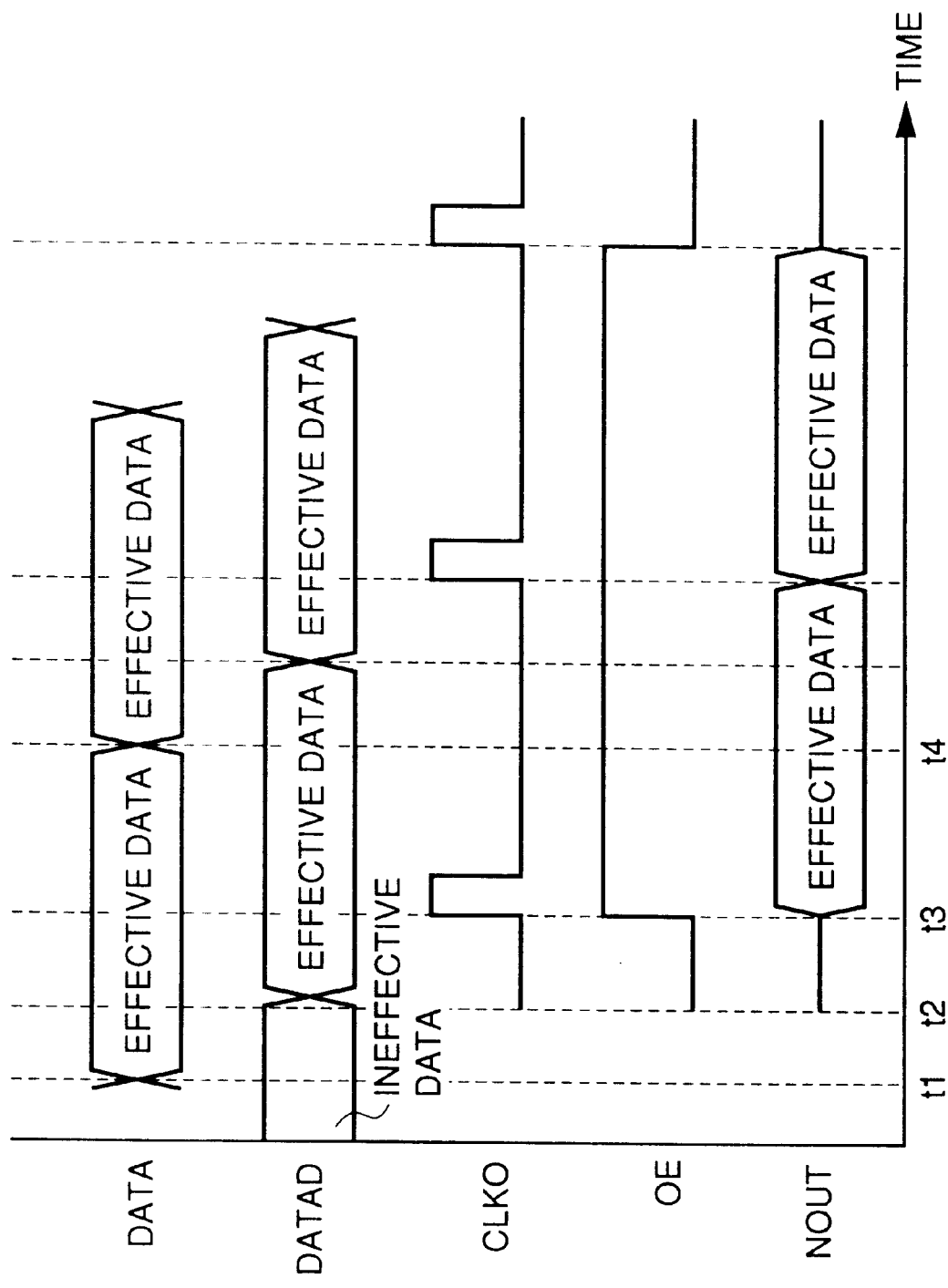
FIG. 4 is an operational waveform chart related to a description of data transfer when a single data bus is selected in a circuit shown in FIG. 2.

FIG. 4 is an operational waveform chart related to a description of data transfer when a single data bus is selected in a circuit shown in FIG. 2.

Referring to FIGS. 2 and 4, when control signal DOUBLE is set to the "L" level, data bus lines 6a and 6b transmit different data signals DATA1 and DATA2, respectively. In this case, differential amplifier 42 outputs the data to data bus lines 102a and 102b without amplification.

Thus, data is output from the data output portion at time t1, and effective data is transmitted as far as to data bus lines 102a and 102b at time t2.

Clock signal CLKO is activated at time t3 when data fully attains the definite state, and then, output enable signal OE is activated, and data are individually output to output nodes NOUT1 and NOUT2 connected to the external data bus.

Figure 5:
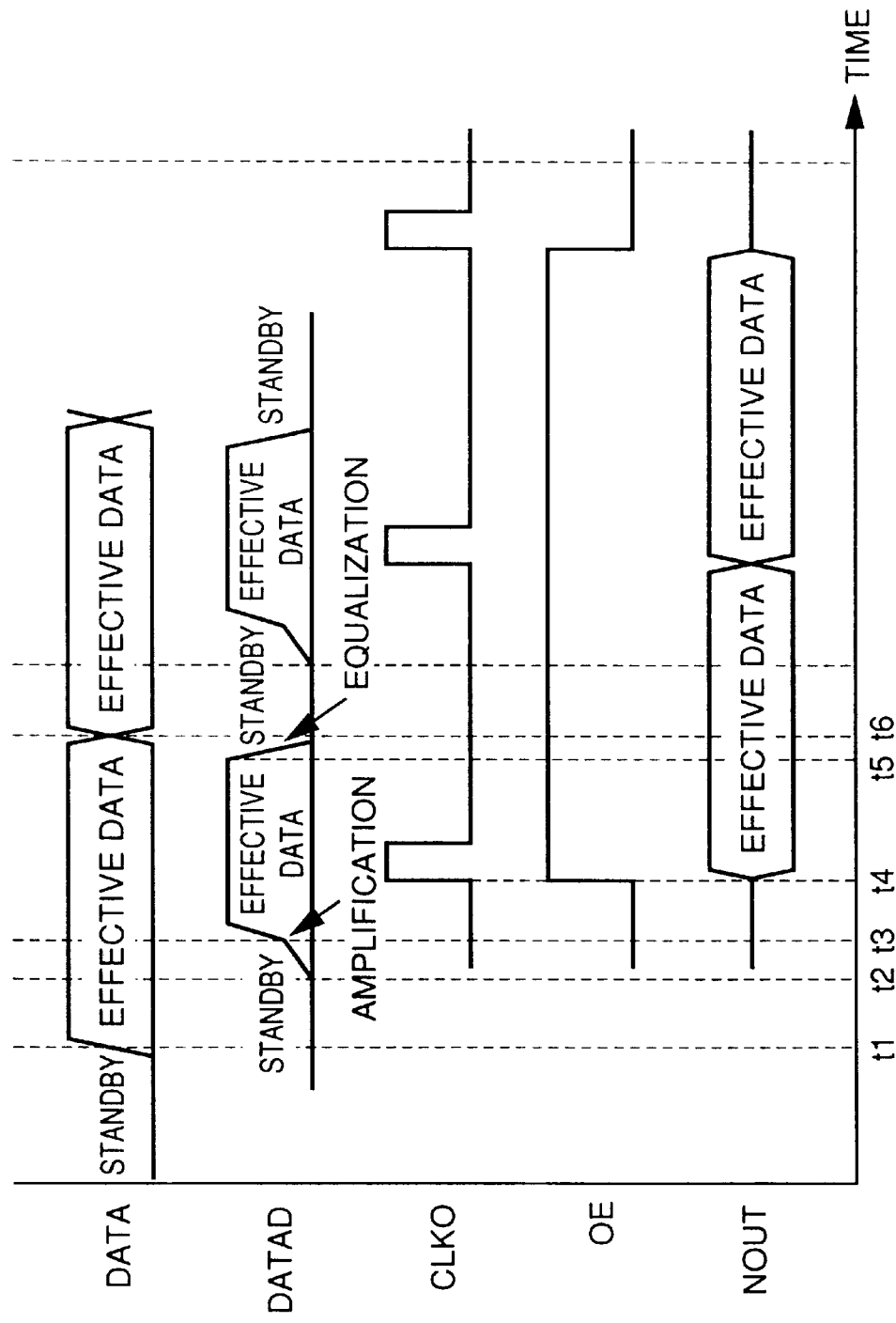
FIG. 5 is an operational waveform chart of a case in which an internal bus is used as a complementary data bus in a circuit shown in FIG. 2.

FIG. 5 is an operational waveform chart of a case in which an internal bus is used as a complementary data bus in a circuit shown in FIG. 2.

Referring to FIGS. 2 and 5, when control signal DOUBLE is set to the "H" level, data signal ZDATA1 is provided to data bus line 6b by the operation of switching circuit 26. Thus, at time t1, one of data bus lines 6a and 6b which are now used as a complementary data bus is activated to the "H" level, and at time t2, data is transmitted to an input portion of differential amplifier 42.

At time t3, differential amplifier 42 is activated, and the potential difference generated between data bus lines 6a and 6b is amplified and output on data bus lines 102a and 102b. In this case, since control signal DOUBLE is at the "H" level, output buffer circuit 46 is not activated by the output enable signal, and only the data being output on data bus line 102a is used.

At time t4, clock signal CLKO is activated, and data is taken into a latch within output buffer circuit 44. Then, output enable signal OE is activated, data is output to output node NOUT1, and effective data is output to the external data bus.

At time t5, equalizing circuit 112 within differential amplifier 42 is activated, and at time t6, differential amplifier 42 and data bus lines 102a and 102b enter the standby state.

Thus as described above, in the semiconductor device according to the first embodiment, data may be transferred with a short delay time, or short latency, even via a bus having a heavy load, by using a differential amplifier when employing complementary data buses, and data of twice as many bits can be simultaneously transferred when employing single data buses.

Such a configuration is particularly effective, as is the case with a semiconductor memory device and the like, for instance, where chips having the same storage capacity often are formed with an output of 8 bits, of 4 bits, or of 16 bits by changing the number of data input/output pins to be used.

Second Embodiment

Figure 6:
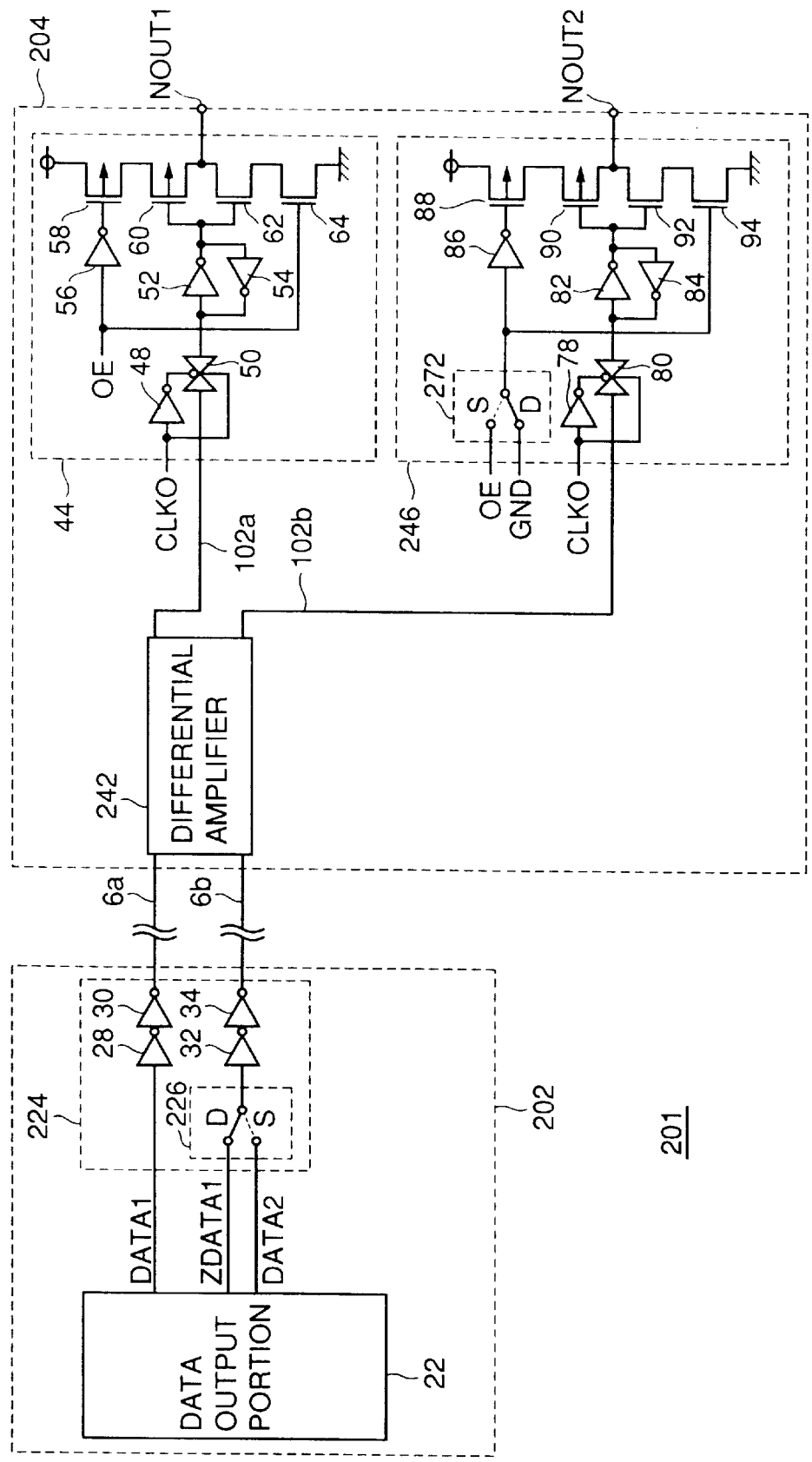
FIG. 6 is a circuit diagram representing a configuration of a semiconductor device 201 according to a second embodiment of the present invention.

FIG. 6 is a circuit diagram representing a configuration of a semiconductor device 201 according to the second embodiment.

As shown in FIG. 6, semiconductor device 201 includes an internal circuit 202, data bus lines 6a and 6b for outputting data from internal circuit 202, and an output circuit 204 for receiving data from data bus lines 6a and 6b and outputting the data to the outside.

Internal circuit 202 includes a bus driving circuit 224 in place of bus driving circuit 24 of the configuration of internal circuit 2 shown in FIG. 2. Bus driving circuit 224 differs from bus driving circuit 24 in that the former includes a connection switching portion 226 in place of switching circuit 26 of the configuration of bus driving circuit 24 shown in FIG. 2. The configurations of other parts are the same as those of internal circuit 2, and the descriptions thereof will not be repeated here.

Output circuit 204 includes a differential amplifier 242 in place of differential amplifier 42 of the configuration of output circuit 4 shown in FIG. 2. Output circuit 204 differs from output circuit 4 shown in FIG. 2 in that the former includes an output buffer circuit 246 in place of output buffer circuit 46.

Output buffer circuit 246 differs from output buffer circuit 46 in that the former includes a connection switching portion 272 in place of switching circuit 72 of the configuration of output buffer circuit 46 shown in FIG. 2. The configurations of other parts are the same as those of output buffer circuit 46, and the descriptions thereof will not be repeated here.

Connection switching portion 226 is set to the connection indicated by D when data bus lines 6a and 6b are used as a complementary bus. On the other hand, it is set to the connection indicated by S when data bus lines 6a and 6b are used as two single data buses.

Similarly, connection switching portion 272 is set to the connection indicated by D when data bus lines 6a and 6b are used as a complementary bus, and is set to the connection indicated by S when data bus lines 6a and 6b are used as two single data buses.

Thus, when data bus lines 6a and 6b are used as a complementary bus, complementary data signal ZDATA1 is transmitted to data bus line 6b by connection switching 226. Data is amplified by the differential amplifier, is then output on data bus line 102a, and is thereafter transmitted to output node NOUT1. Output buffer circuit 246, however, does not output data, since P-channel MOS transistor 88 and N-channel MOS transistor 94 are rendered inactive by connection switching portion 272.

Figure 7:
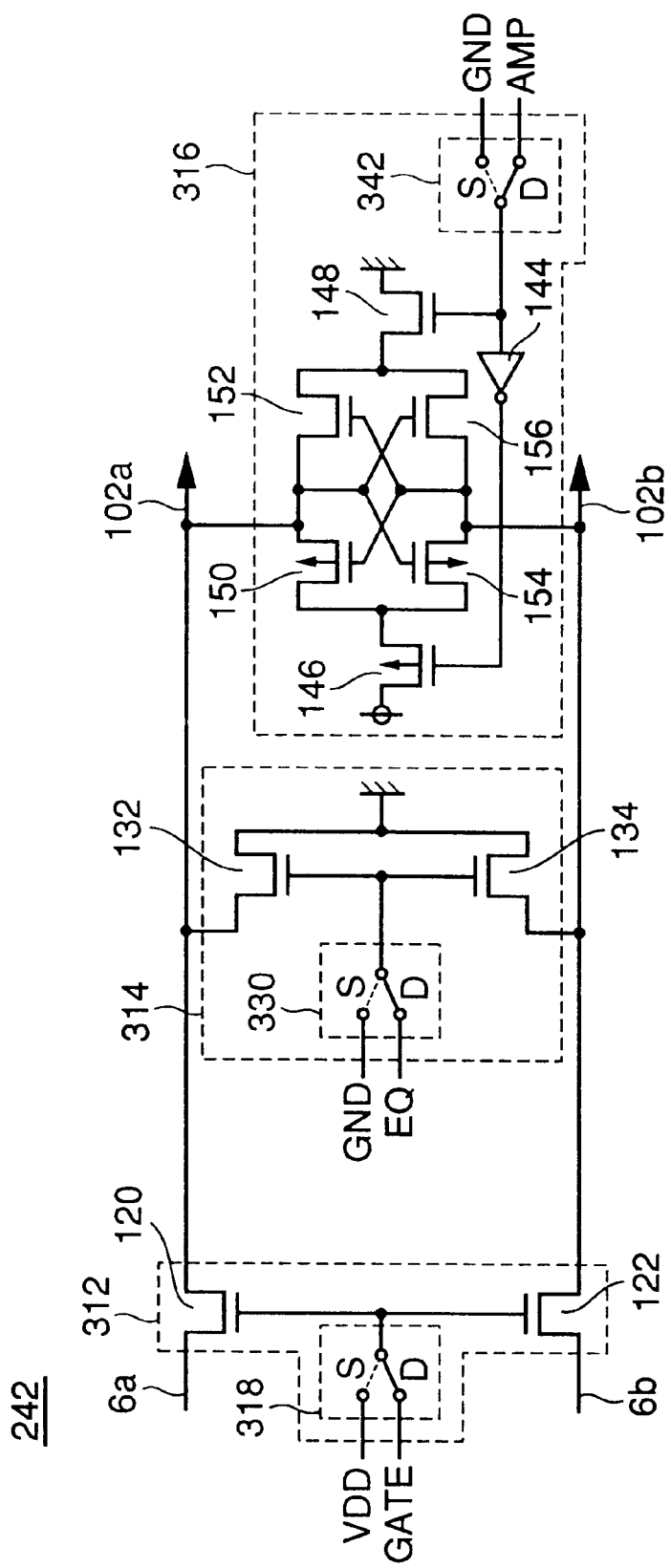
FIG. 7 is a circuit diagram representing a configuration of a differential amplifier 242 in FIG. 6.

FIG. 7 is a circuit diagram representing a configuration of differential amplifier 242 in FIG. 6.

As shown in FIG. 7, differential amplifier 242 includes a gate circuit 312, an equalizing circuit 314, and a sense amplifier circuit 316.

Gate circuit 312 includes a connection switching portion 318 in place of switching circuit 118 of the configuration of gate circuit 112 shown in FIG. 3. Equalizing circuit 314 includes a connection switching portion 330 in place of switching circuit 130 of the configuration of equalizing circuit 114 shown in FIG. 3.

Sense amplifier 316 includes a connection switching portion 342 in place of switching circuit 142 of the configuration of sense amplifier circuit 116 shown in FIG. 3. Connection switching portions 318, 330, and 342 are set to the connection indicated by D when data bus lines 6a and 6b are used as a complementary bus, and are set to the connection indicated by S when data bus lines 6a and 6b are used as two single data buses.

The connections of connection switching portions 226, 272, 318, 330, and 342 shown in FIGS. 6 and 7 are switched by changing the mask pattern used for forming a metal interconnection layer. Thus, the production of semiconductor devices may be carried out nearly up to the final steps, and the semiconductor devices may be stored as master slices. The changing of the masks allows the adjustment in producing various types of products in the amounts required, which achieves a reduction in the production cost.

Third Embodiment

Figure 8:
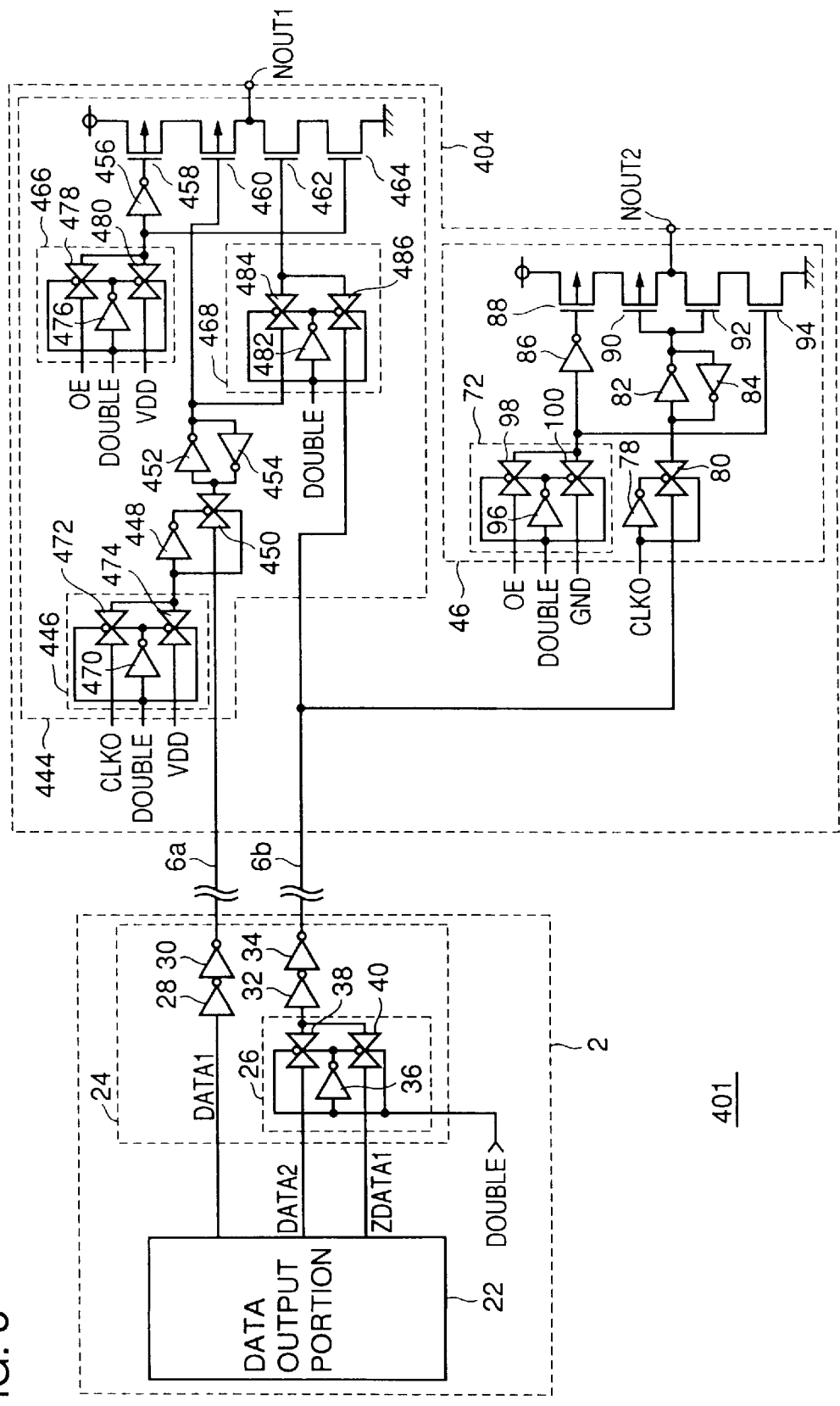
FIG. 8 is a circuit diagram representing a configuration of a semiconductor device 401 according to a third embodiment of the present invention.

FIG. 8 is a circuit diagram representing a configuration of a semiconductor device 401 according to the third embodiment.

As shown in FIG. 8, semiconductor device 401 includes an output circuit 404 in place of output circuit 4 of the configuration of semiconductor device 1 shown in FIG. 2. Output circuit 404 includes an output buffer circuit 444 in place of differential amplifier 42 and output buffer circuit 44 of the configuration of output circuit 4 in FIG. 2.

Output buffer 444 includes a switching circuit 446 for outputting one of a clock signal CLKO and a power-supply potential VDD according to a control signal DOUBLE, an inverter 448 for receiving and inverting an output from switching circuit 446, a transmission gate 450 for transmitting data, transmitted via data bus line 6a, according to an output from inverter 448 and to the output from switching circuit 446, and inverters 452 and 454 forming a latch circuit for holding the data transmitted by transmission gate 450.

Output buffer circuit 444 further includes a switching circuit 468 for outputting one of an output from inverter 452 and data transmitted via data bus line 6b according to control signal DOUBLE, a switching circuit 466 for selecting and outputting one of an output enable signal OE and a power-supply potential VDD according to control signal DOUBLE, an inverter 456 for receiving and inverting an output from switching circuit 466, P-channel MOS transistors 458 and 460 connected in series between a power-supply node and an output node NOUT1, and N-channel MOS transistors 462 and 464 connected in series between output node NOUT1 and a ground node.

P-channel MOS transistor 458 receives an output from inverter 456 at a gate. P-channel MOS transistor 460 receives an output from inverter 452 at a gate. N-channel MOS transistor 462 receives an output from switching circuit 468 at a gate. N-channel MOS transistor 464 receives an output form switching circuit 466 at a gate.

Switching circuit 446 includes an inverter 470 for receiving and inverting control signal DOUBLE, a transmission gate 474 for transmitting power-supply potential VDD when control signal DOUBLE is at the "H" level, and a transmission gate 472 for transmitting clock signal CLKO when control signal DOUBLE is at the "L" level.

Switching circuit 466 includes an inverter 476 for receiving and inverting control signal DOUBLE, a transmission gate 480 for transmitting power-supply potential VDD when control signal DOUBLE is at the "H" level, and a transmission gate 478 transmitting output enable signal OE when control signal DOUBLE is at the "L" level.

Switching circuit 468 includes an inverter 482 for receiving and inverting control signal DOUBLE, a transmission gate 486 for receiving and transmitting data from data bus line 6b when control signal DOUBLE is at the "H" level, and a transmission gate 484 for receiving and transmitting an output from inverter 452 when control signal DOUBLE is at the "L" level.

The configurations of other parts are the same as those of semiconductor device 1 shown in FIG. 2, and the descriptions thereof will not be repeated here.

Figure 9:
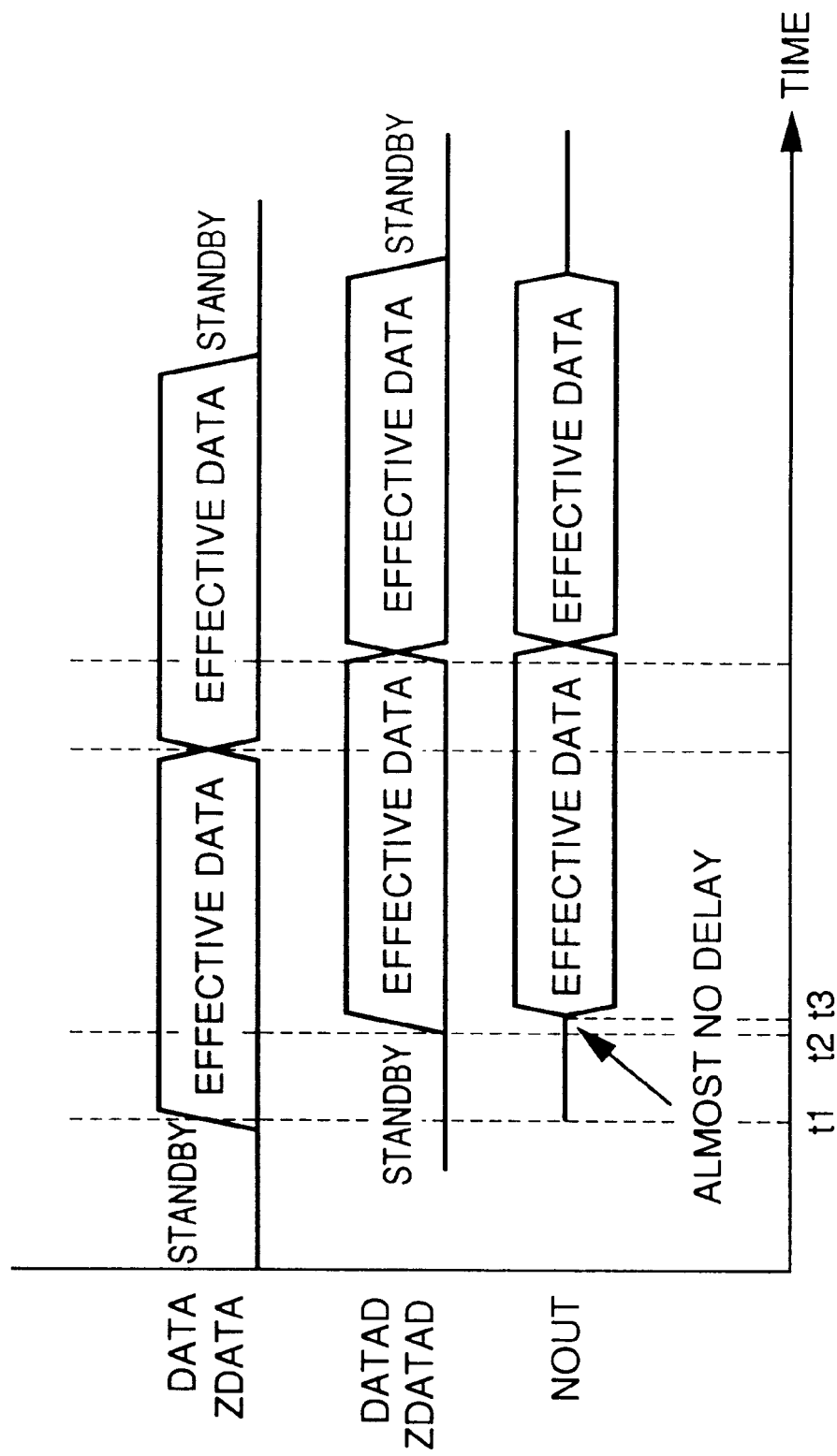
FIG. 9 is an operational waveform chart related to a description of a case in which data bus lines 6a and 6b in FIG. 8 operate as a complementary data bus.

FIG. 9 is an operational waveform chart related to a description of a case in which data bus lines 6a and 6b in FIG. 8 operate as a complementary data bus.

Referring to FIGS. 8 and 9, data signals DATA and ZDATA are both at the "L" level before time t1. This state is the standby state of the complementary bus.

At time t1, one of data signals DATA and ZDATA attains the "H" level and the effective data is output.

At time t2, one of data signals DATAD and ZDATAD after the delay time caused by complementary data bus 6a and 6b attains the "H" level, and the effective data is propagated to output circuit 404.

Accordingly, at time t3, one of P-channel MOS transistor 460 and N-channel MOS transistor 462 is rendered conductive, and the effective data is output to external data bus. P-channel MOS transistor 458 and N-channel MOS transistor 464 are controlled to remain in the conductive state at all times by the setting of switching circuit 466.

Since the standby state of the complementary bus is defined by the condition of both P-channel MOS transistor 460 and N-channel MOS transistor 462 being nonconductive, the transition of data from its ineffective state to the effective state triggers the outputting of the data to the external data bus.

Therefore, the delay time between time t2 and time t3 is substantially eliminated and the period for which data is effective can be fully utilized.

Moreover, output buffer circuit 46 is rendered inactive by the setting of control signal DOUBLE when data bus lines 6a and 6b are used as a complementary data bus.

In addition, the waveform for the case in which data bus lines 6a and 6b shown in FIG. 8 are used as two single data buses is the same as that described in relation to FIG. 4 so that the description thereof will not be repeated here.

With such a configuration, the delay time can be shortened when employing a complementary data bus, or data of twice as many bits can be simultaneously transferred when employing single data buses.

Fourth Embodiment

Figure 10:
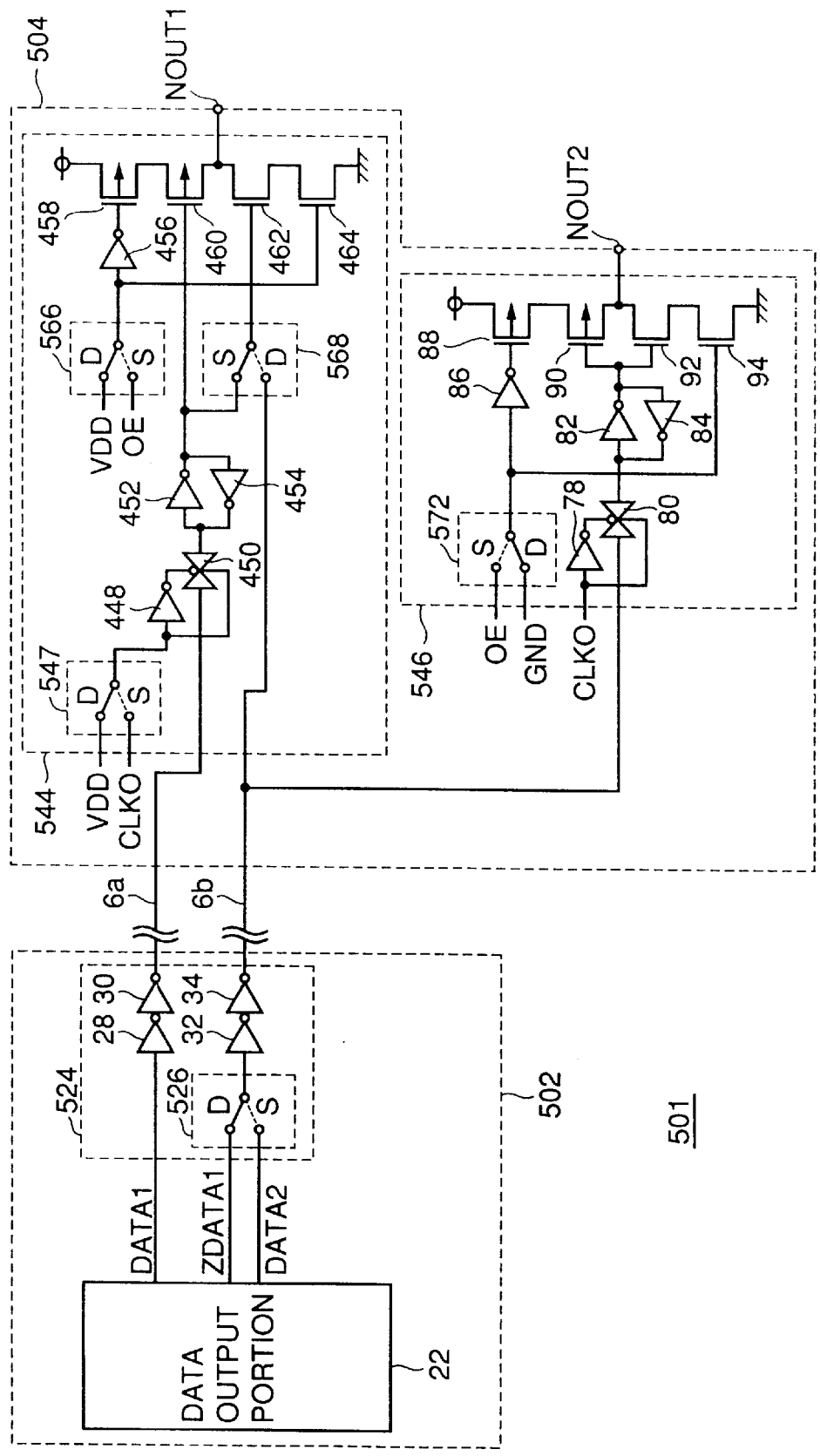
FIG. 10 is a circuit diagram representing a configuration of a semiconductor device 501 according to a fourth embodiment of the present invention.
Figure 11:
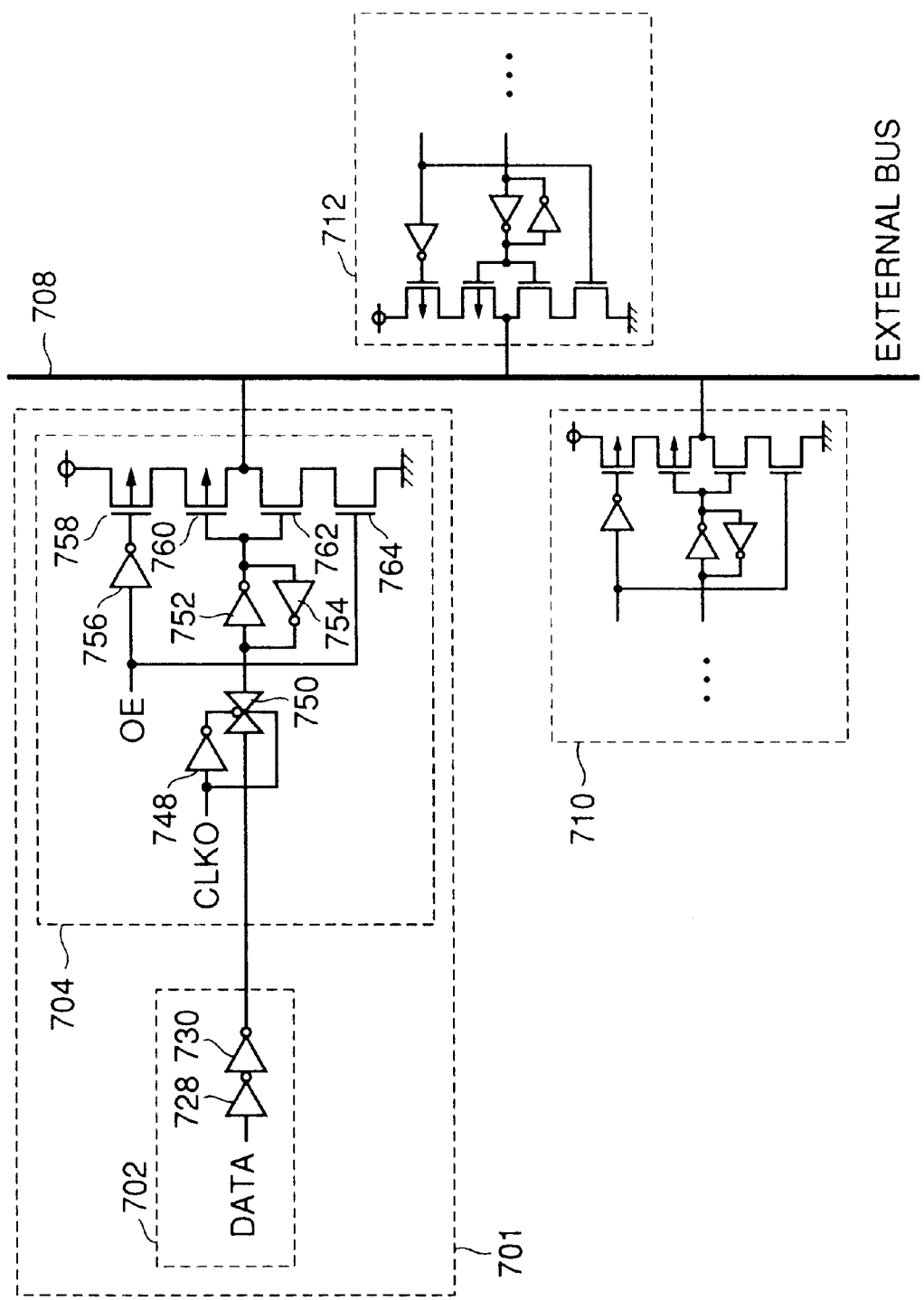
FIG. 11 is a diagram related to a description of a single data bus in a conventional semiconductor device.
Figure 12:
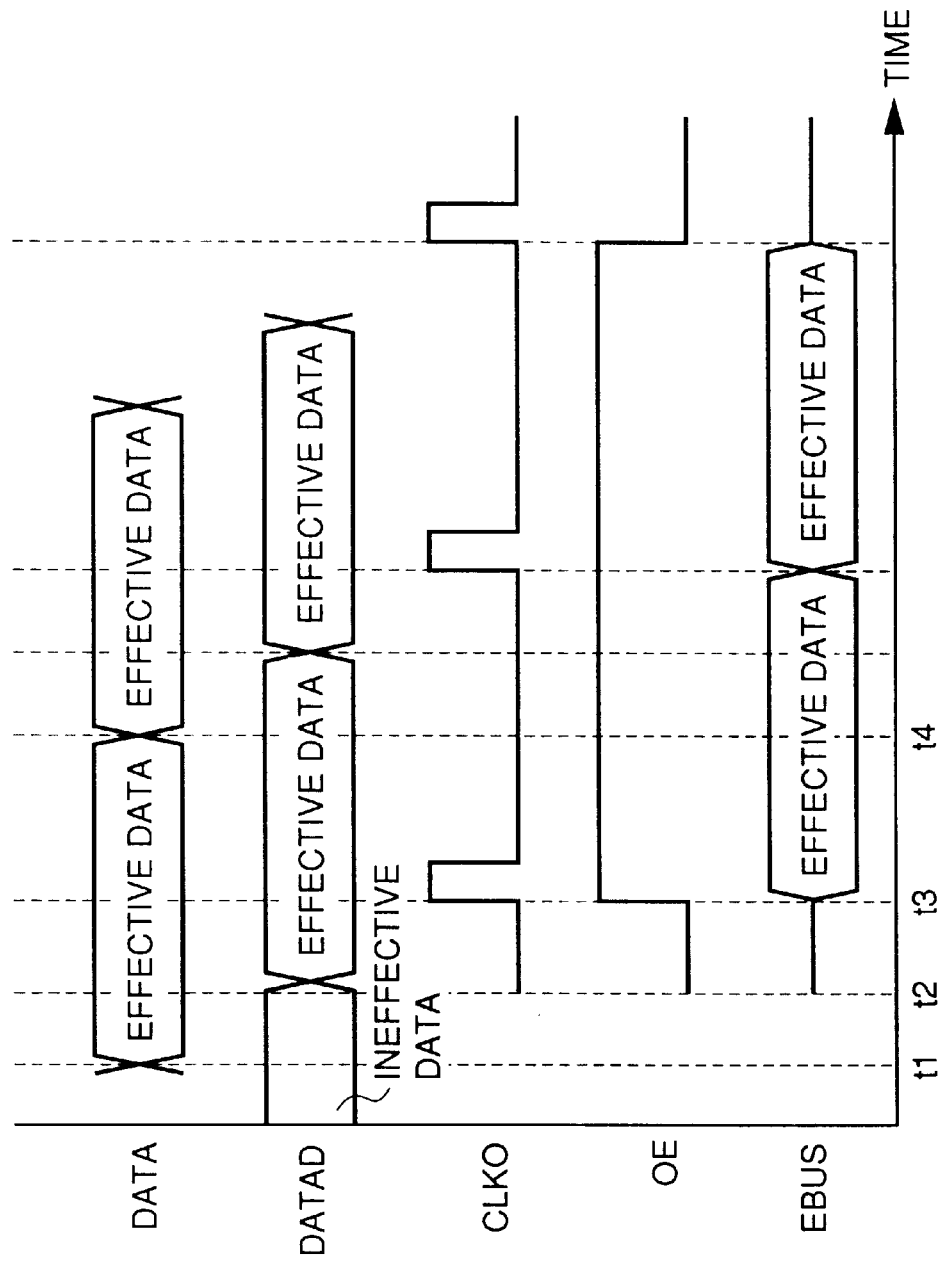
FIG. 12 is an operational waveform chart for semiconductor device 701 shown in FIG. 11 when outputting data.
Figure 13:
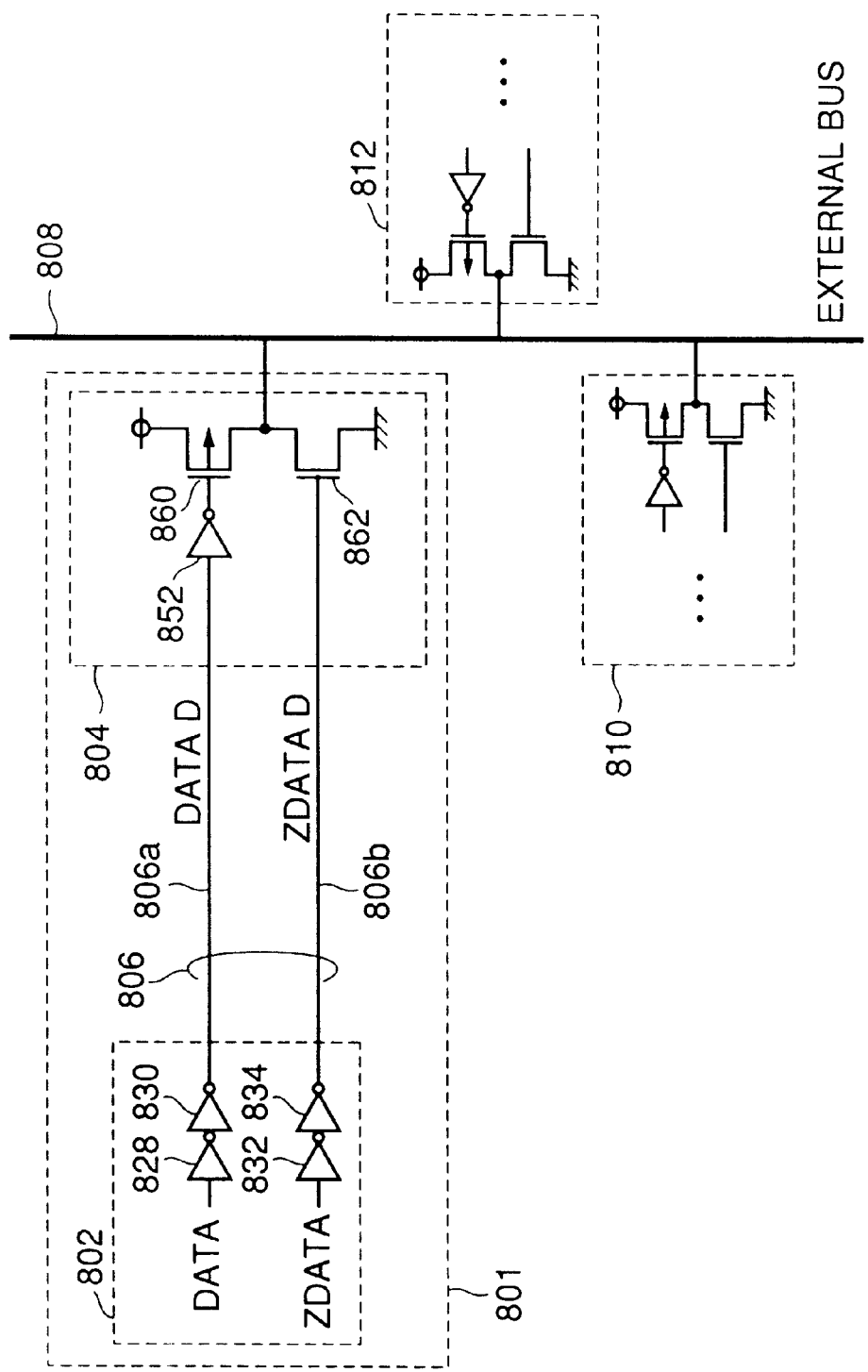
FIG. 13 is a diagram related to a description of a complementary data bus.
Figure 14:
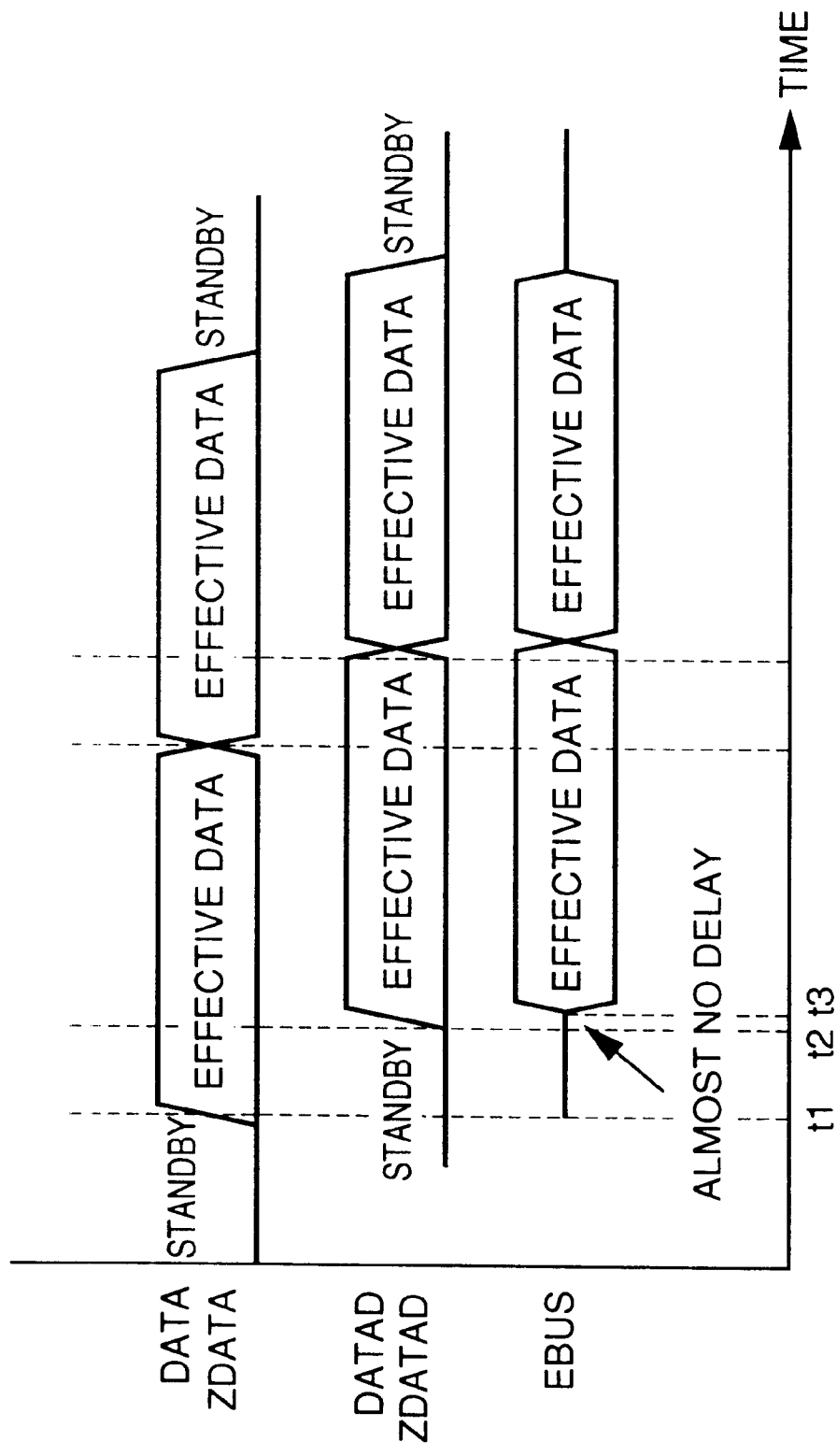
FIG. 14 is an operational waveform chart related to a description of an operation of the complementary bus shown in FIG. 13.
Figure 15:
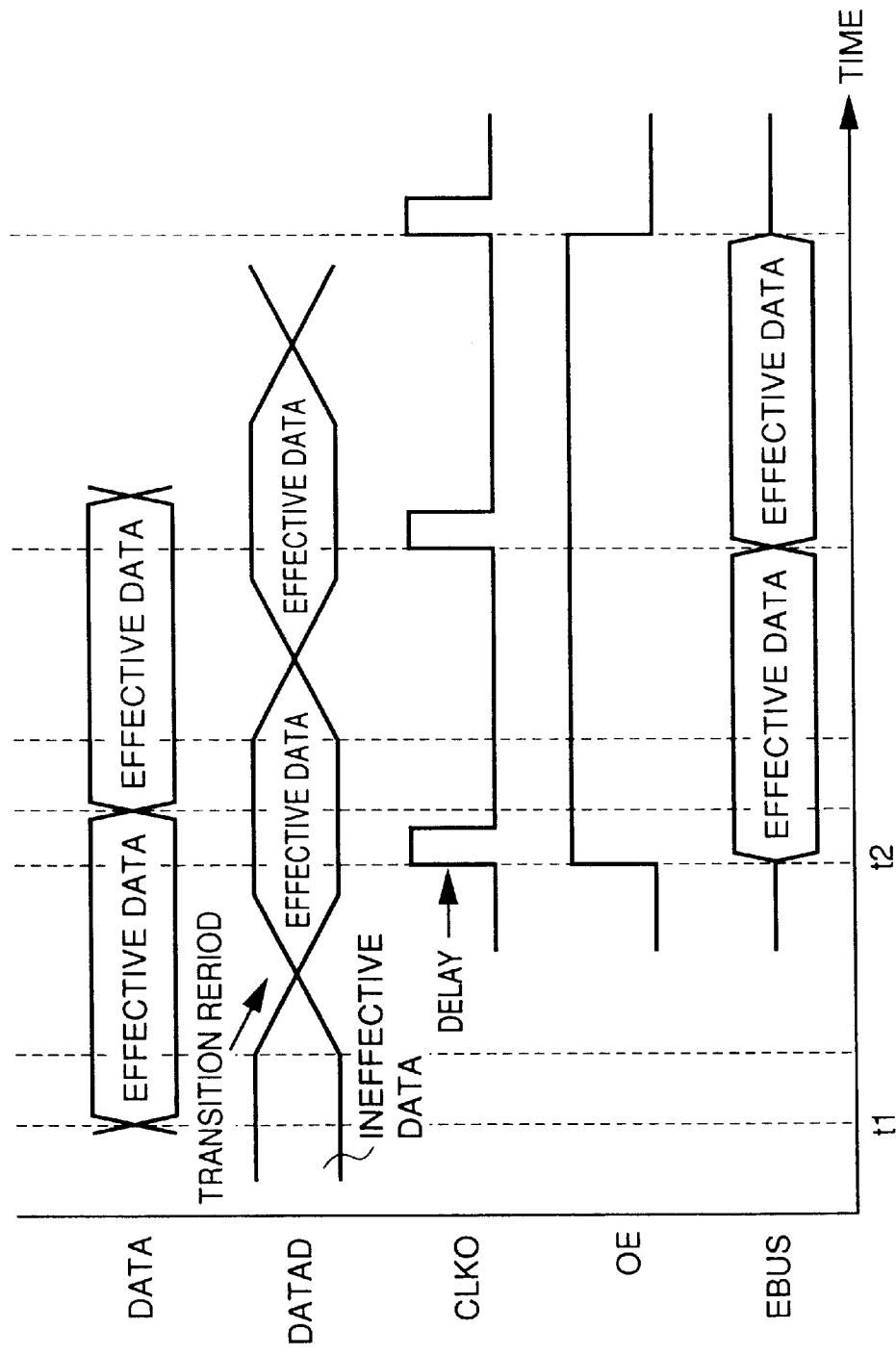
FIG. 15 is an operational waveform chart of a case in which a single data bus has a heavy load capacitance.
Figure 16:
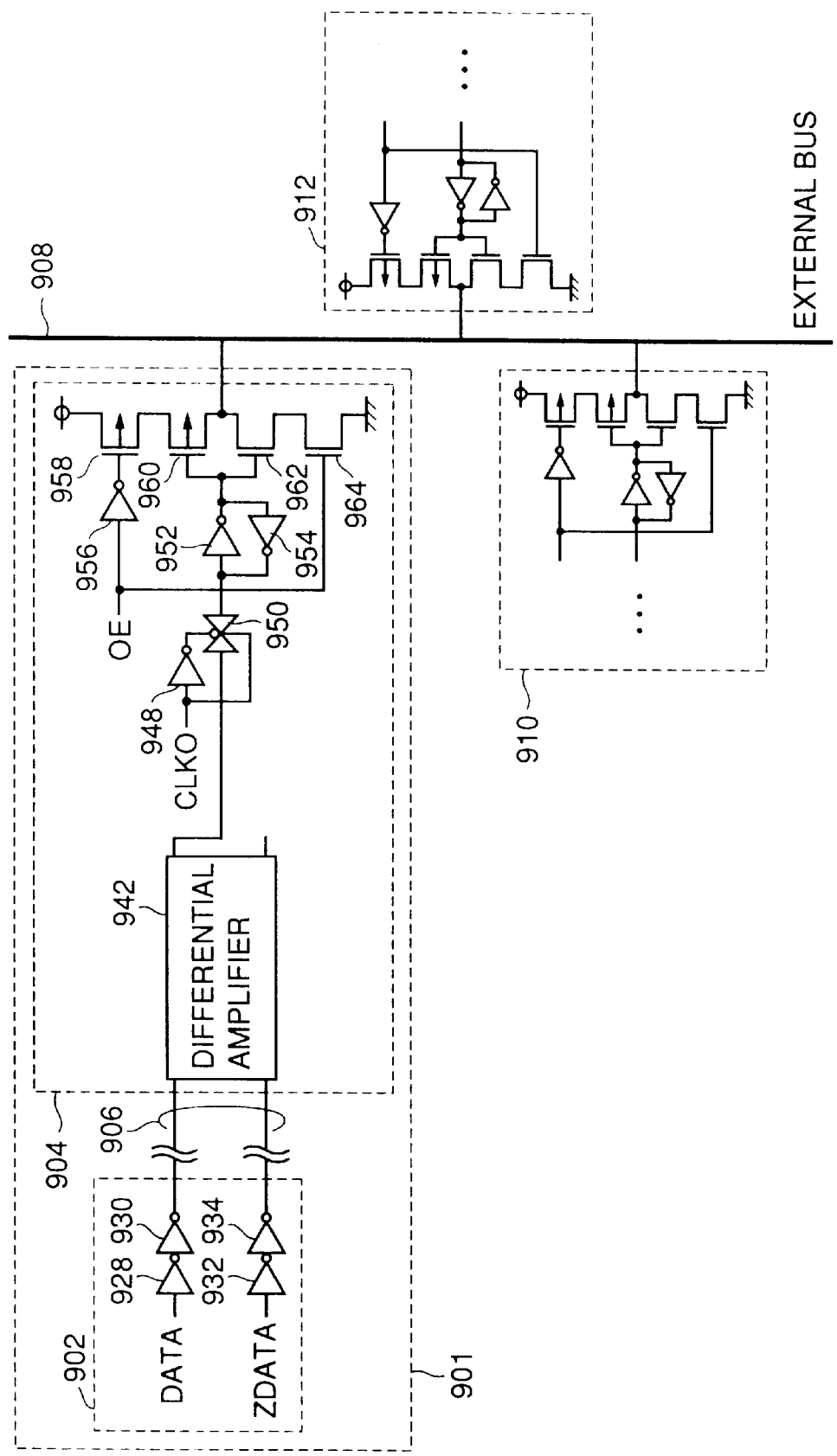
FIG. 16 is a simple representation of a configuration of a semiconductor device 901 in which an output circuit is provided with a differential amplifier.
Figure 17:
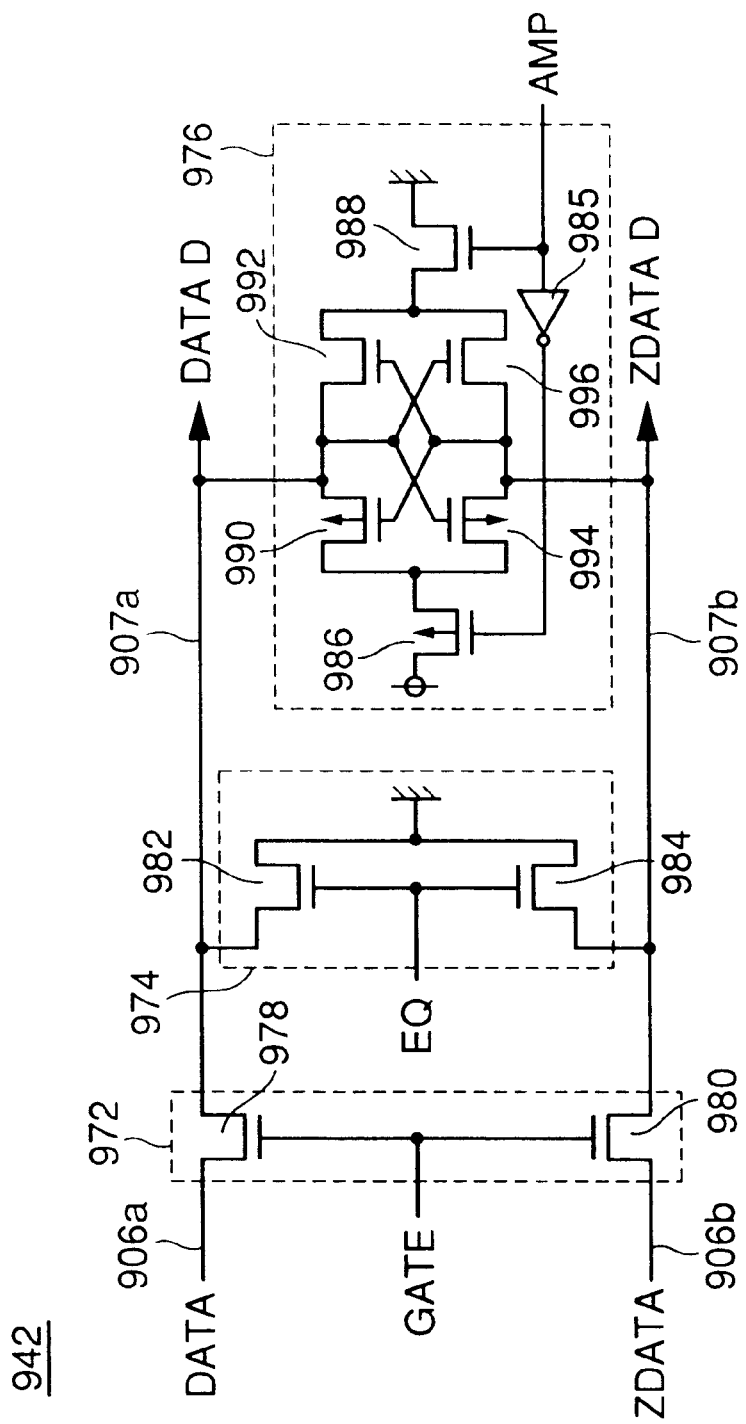
FIG. 17 is a circuit diagram showing a configuration of a differential amplifier 942 shown in FIG. 16.
Figure 18:
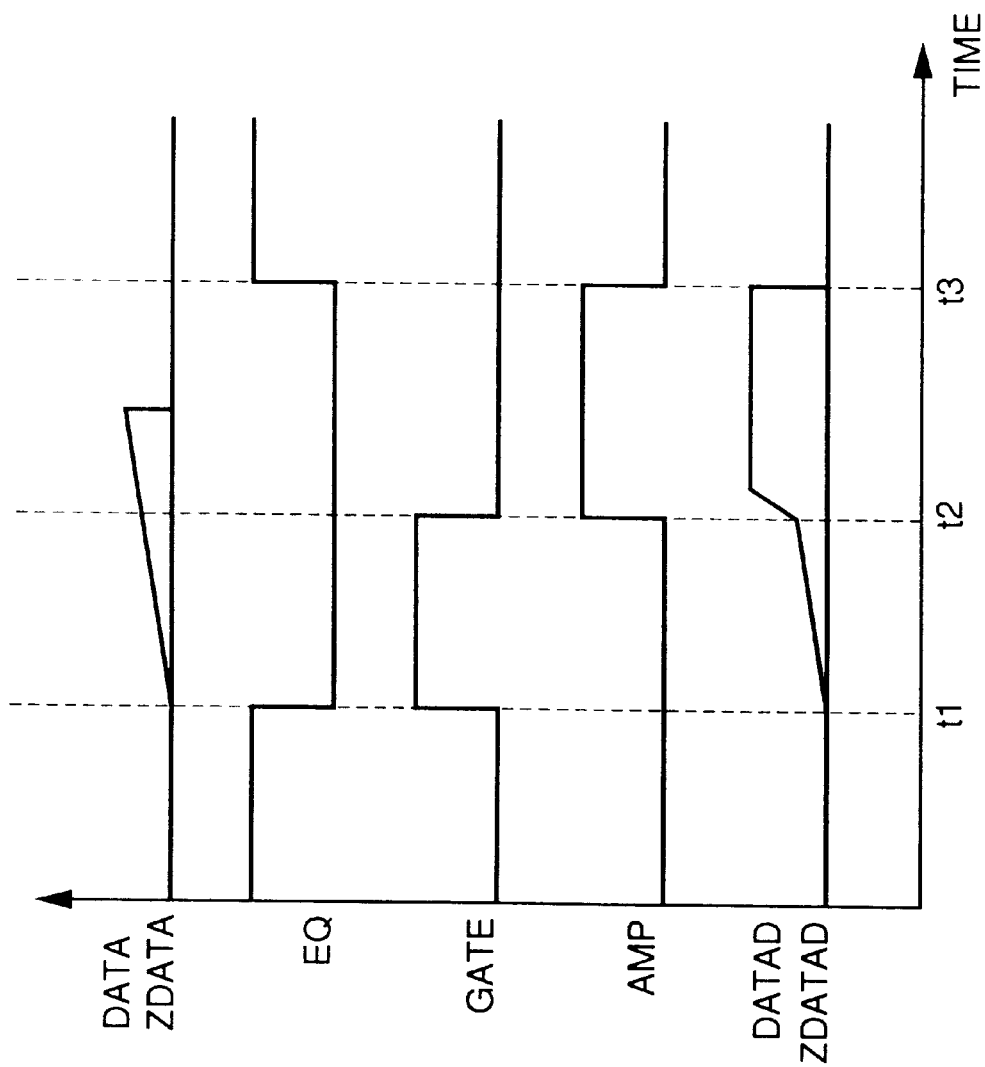
FIG. 18 is an operational waveform chart related to a description of an operation of the differential amplifier shown in FIG. 17.
Figure 19:
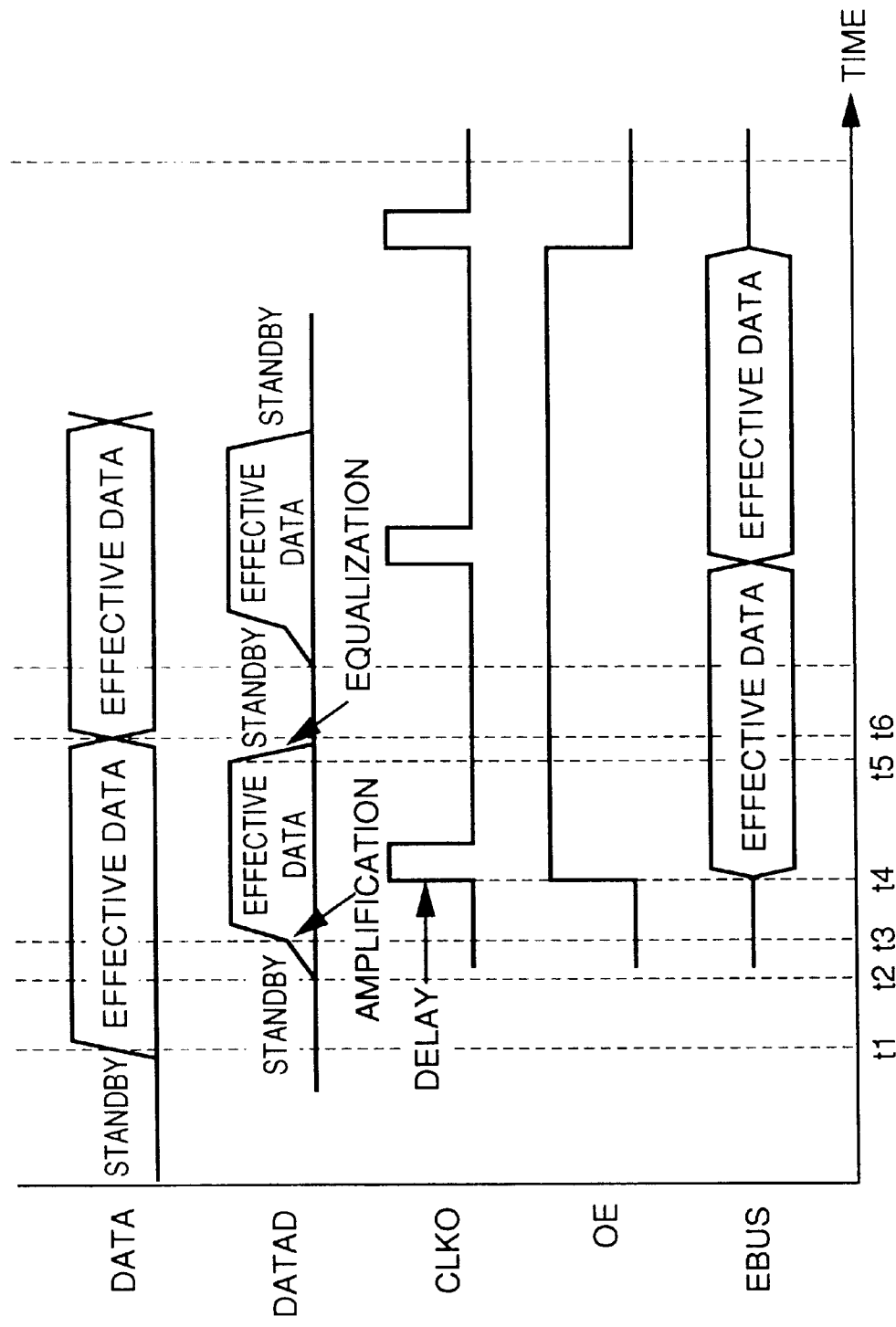
FIG. 19 is an operational waveform chart showing how data is transmitted in semiconductor device 901 shown in FIG. 16.
Figure 20:
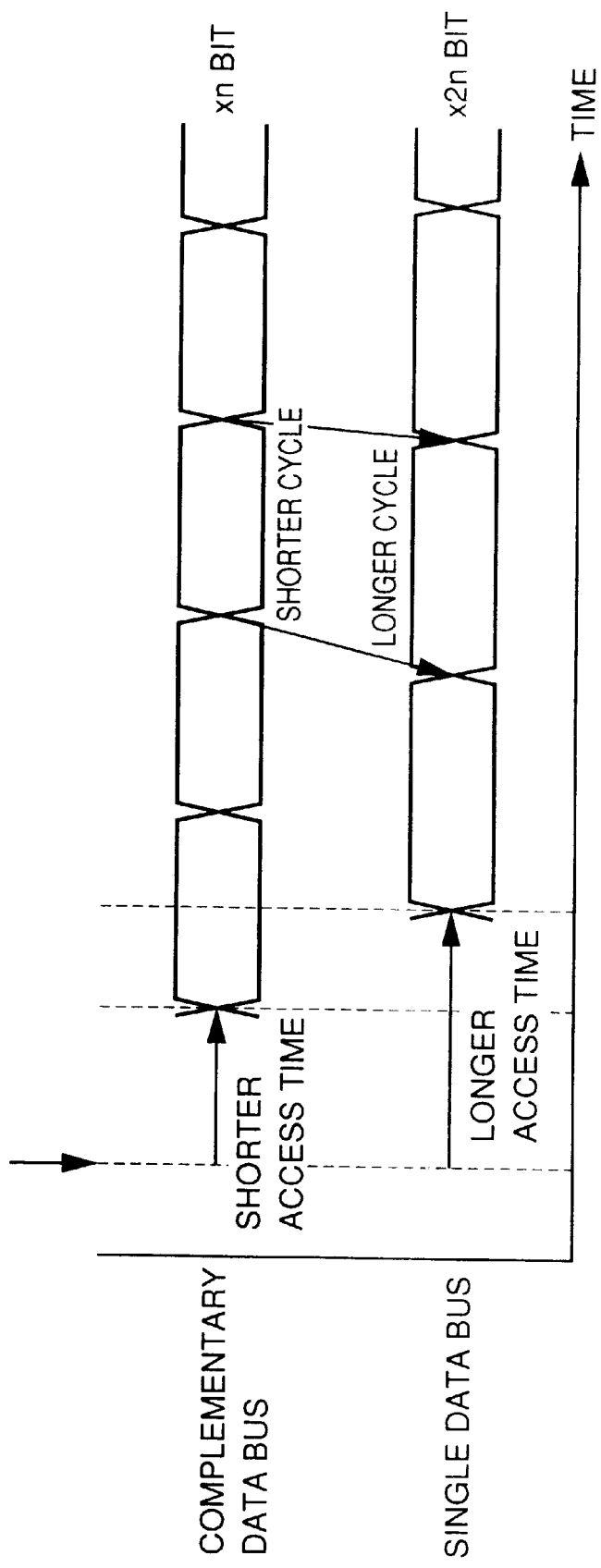
FIG. 20 is a diagram showing a comparison of data transfers using a single data bus and a complementary data bus.

FIG. 10 is a circuit diagram representing a configuration of a semiconductor device 501 according to the fourth embodiment.

As shown in FIG. 10, semiconductor device 501 includes an internal circuit 502 for outputting a data signal to a data bus, and an output circuit 504 for receiving data from a data bus and for outputting the data to the outside.

Internal circuit 502 includes a bus driving circuit 524 in place of bus driving circuit 24 of the configuration of internal circuit 2 shown in FIG. 2.

Bus driving circuit 524 differs from bus driving circuit 24 shown in FIG. 2 in that the former includes a connection switching portion 526 in place of switching circuit 26. The configurations of other parts are the same as those of internal circuit 2, and the descriptions thereof will not be repeated here.

Output circuit 504 includes an output buffer circuit 544 for receiving data from data bus lines 6a and 6b and outputting the received data to an output node NOUT1, and an output buffer circuit 546 for receiving data from data bus line 6b and outputting the received data to an output node NOUT2.

Output buffer circuit 544 includes connection switching portions 547, 566, and 568 in place of switching circuits 446, 466, and 468 of the configuration of output buffer circuit 444 shown in FIG. 8. When the data bus lines are used as a complementary data bus, connection switching portion 547 provides a power-supply potential VDD to an inverter 448 and a transmission gate 450.

On the other hand, when the data bus lines are used as two single data buses, a clock signal CLKO is provided to inverter 448 and transmission gate 450. Connection switching portion 566 provides a power-supply potential to an input of an inverter 456 and a gate of an N-channel MOS transistor 464 when the data bus lines are used as a complementary data bus, and provides an output enable signal OE to the input of inverter 456 and the gate of N-channel MOS transistor 464 when the data bus lines are used as two single data buses.

Connection switching portion 568 connects data bus line 6b to a gate of an N-channel MOS transistor 462 when the data bus lines are used as a complementary data bus. On the other hand, connection switching portion 568 provides an output from an inverter 452 to a gate of N-channel MOS transistor 462 when the data bus lines are used as two single data buses.

Output buffer circuit 546 includes a connection switching portion 572 in place of switching circuit 72 of the configuration of output buffer circuit 46 in FIG. 8.

Connection switching portion 572 provides a ground potential GND to an input of an inverter 86 and to a gate of an N-channel MOS transistor 94 when internal data bus lines are used as a complementary data bus.

On the other hand, an output enable signal OE is provided to the input of inverter 86 and to the gate of N-channel MOS transistor 94 when internal data bus lines are used as two single data buses.

The configurations of other parts are the same as those of semiconductor device 401 shown in FIG. 8 so that the descriptions thereof will not be repeated here.

Further, the operation is the same as that of the third embodiment so that the description will not be repeated here.

Thus, the production of various types of products becomes possible by simply changing the masks used for forming a metal interconnection layer. The semiconductor devices may be stored as master slices to allow a variety of products to be formed at a later time using the masks according to need.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an internal circuit, including
        a data output portion for outputting a first data signal, a second data signal, and a third data signal complementary to said first data signal, and
        a first switching circuit for outputting one of said second data signal and said third data signal;
    a first data bus line for receiving said first data signal;
    a second data bus line for receiving an output from said first switching circuit; and
    an output circuit including
        a first output buffer circuit for outputting a first output signal corresponding to said first data signal, and
        a second output buffer circuit which outputs a second output signal corresponding to said second data signal when said first switching circuit outputs said second data signal, and which is rendered inactive when said first switching circuit outputs said third data signal.

2. The semiconductor device according to claim 1, wherein said output circuit further includes a differential amplifier circuit for outputting a detecting signal corresponding to a potential difference generated between said first data bus line and said second data bus line to said first output buffer circuit when said first switching circuit outputs said third data signal, and for outputting signals transmitted via said first and second data bus lines respectively to said first and second output buffer circuits when said first switching circuit outputs said second data signal.

3. The semiconductor device according to claim 2, wherein said output circuit further includes a third data bus line and a fourth data bus line, and said differential amplifier circuit includes
    an equalizing circuit being once activated before said first and third data signals are transmitted to said output circuit to couple both said third and fourth data bus lines to a fixed potential when said first switching circuit outputs said third data signal, and being rendered inactive when said first switching circuit outputs said second data signal,
    a gate circuit for respectively connecting said first data bus line with said third data bus line and said second data bus line with said fourth data bus line when said first switching circuit outputs said second data signal, and for respectively connecting said first data bus line with said third data bus line and said second data bus line with said fourth data bus line after said first and third data signals are transmitted to said output circuit and after said equalizing circuit is rendered inactive when said first switching circuit outputs said third data signal, and a sense amplifier circuit being activated after said first and third data signals are transmitted to said output circuit to magnify a potential difference between said third data bus line and said fourth data bus line when said first switching circuit outputs said third data signal, and being rendered inactive when said first switching circuit outputs said second data signal.

4. The semiconductor device according to claim 1, wherein said first switching circuit includes a first internal node for receiving said second data signal, a second internal node for receiving said third data signal, an output node provided to output a signal from said first switching circuit, and a metal interconnection line for connecting one of said first internal node and said second internal node to said output node.

5. The semiconductor device according to claim 1, wherein said output circuit further includes a third data bus line whose potential changes according to said first data signal, and a fourth data bus line whose potential changes according to said second data signal when said first switching circuit outputs said second data signal, and wherein said first output buffer circuit outputs the first output signal to outside according to a change in potential of said third data bus line, and said second output buffer circuit includes a second switching circuit for outputting an activation signal when said first switching circuit outputs the first output signal second data signal, and for outputting an inactivation signal when said first switching circuit outputs said third data signal, and an output portion for outputting the second output signal according to an output from said second switching circuit and to a change in potential of said fourth data bus.

6. The semiconductor device according to claim 5, wherein said second switching circuit includes a first internal node for receiving an output enable signal for activating said output portion, a second internal node for receiving an inactivation potential of said output enable signal, an output node provided to output a signal from said second switching circuit, and a metal interconnection line for connecting one of said first internal node and said second internal node to said output node.

7. The semiconductor device according to claim 1, wherein said first output buffer circuit includes an output terminal for outputting the first output signal to outside, a first transistor provided in a path coupling said output terminal with a first power-supply node to which a first power-supply potential is provided and being rendered conductive according to a change in potential of said first data bus line, a second switching circuit for outputting a signal corresponding to a change in potential of said second data bus line when said first switching circuit outputs said third data signal, and for outputting a signal corresponding to a change in potential of said first data bus line when said first switching circuit outputs said second data signal, and a second transistor provided in a path coupling said output terminal with a second power-supply node to which a second power-supply potential different from said first power-supply potential is provided and being rendered conductive according to an output from said third switching circuit.

8. The semiconductor device according to claim 7, wherein said second switching circuit includes a first internal node for receiving a signal corresponding to a change in potential of said first data bus line, a second internal node for receiving a signal corresponding to a change in potential of said second data bus line, an output node provided to output a signal from said second switching circuit, and a metal interconnection line for connecting one of said first internal node and said second internal node to said output node.

9. The semiconductor device according to claim 7, wherein said first output buffer circuit further includes a third transistor connected in series with said first transistor on the path coupling said output terminal with said first power-supply node, a fourth transistor connected in series with said second transistor on the path coupling said output terminal with said second power-supply node, and a third switching circuit for controlling conductive states of said third and fourth transistors, wherein said third switching circuit controls the conductive states of said third and fourth transistors such that said third and fourth transistors are rendered conductive when said first switching circuit outputs said third data signal, and controls the conductive states of said third and fourth transistors such that said third and fourth transistors are rendered conductive according to a timing at which data is output when said first switching circuit outputs said second data signal.

10. The semiconductor device according to claim 9, wherein said third switching circuit includes a first internal node for receiving an output enable signal, a second internal node for receiving an activation potential of said output enable signal, an output node provided to output a signal from said third switching circuit, and a metal interconnection line for connecting one of said first internal node and said second internal node to said output node.

* * * * *